United States Patent
Nonaka et al.

(10) Patent No.: US 9,580,567 B2
(45) Date of Patent: *Feb. 28, 2017

(54) POSITIVE-TYPE PHOTOSENSITIVE SILOXANE COMPOSITION

(71) Applicant: AZ ELECTRONIC MATERIALS (LUXEMBOURG) S.A.R.L., Luxembourg (LU)

(72) Inventors: Toshiaki Nonaka, Shizuoka (JP); Daishi Tokoyama, Shizuoka (JP); Takashi Fuke, Shizuoka (JP); Yuji Tashiro, Shizuoka (JP)

(73) Assignee: AZ ELECTRONIC MATERIALS (LUXEMBOURG) S.A.R.L., Luxembourg (LU)

( * ) Notice: Subject to any disclaimer, the term of this patent is extended or adjusted under 35 U.S.C. 154(b) by 0 days.

This patent is subject to a terminal disclaimer.

(21) Appl. No.: 14/439,870

(22) PCT Filed: Nov. 14, 2013

(86) PCT No.: PCT/JP2013/080761
§ 371 (c)(1),
(2) Date: Apr. 30, 2015

(87) PCT Pub. No.: WO2014/080827
PCT Pub. Date: May 30, 2014

(65) Prior Publication Data
US 2015/0291749 A1   Oct. 15, 2015

(30) Foreign Application Priority Data

Nov. 22, 2012  (JP) .................. 2012-256754

(51) Int. Cl.
| | | |
|---|---|---|
| C09D 183/04 | (2006.01) | |
| C08J 5/18 | (2006.01) | |
| G03F 7/023 | (2006.01) | |
| G03F 7/075 | (2006.01) | |

(52) U.S. Cl.
CPC .............. *C08J 5/18* (2013.01); *C09D 183/04* (2013.01); *G03F 7/0233* (2013.01); *G03F 7/0757* (2013.01); *C08J 2383/06* (2013.01)

(58) Field of Classification Search
CPC .................................................. C09D 183/04
See application file for complete search history.

(56) References Cited

U.S. PATENT DOCUMENTS

| | | | |
|---|---|---|---|
| 8,883,397 B2* | 11/2014 | Yokoyama ............ | G03F 7/0757 430/18 |
| 8,993,214 B2* | 3/2015 | Yokoyama ............. | C08G 77/04 430/18 |
| 9,164,386 B2* | 10/2015 | Yokoyama ............. | C07F 7/1836 |
| 2005/0123854 A1* | 6/2005 | Ogata ................... | G03F 7/0757 430/270.1 |
| 2005/0227171 A1* | 10/2005 | Kawana ................ | G03F 7/0757 430/270.1 |
| 2006/0192481 A1 | 8/2006 | Nagayama et al. | |
| 2012/0141936 A1 | 6/2012 | Wu et al. | |

FOREIGN PATENT DOCUMENTS

| | | |
|---|---|---|
| JP | 2933879 B2 | 5/1999 |
| JP | 2961722 B2 | 8/1999 |
| JP | 3783512 B2 | 3/2006 |
| JP | 2006-236839 A | 9/2006 |
| JP | 2007-119777 A | 5/2007 |
| JP | 2007-193318 A | 8/2007 |
| JP | 2007-293160 A | 11/2007 |
| JP | 2010-43030 A | 2/2010 |
| JP | 2011-227159 A | 11/2011 |
| JP | 2012-123391 A | 6/2012 |
| WO | WO 2012/026400 A1 | 3/2012 |

OTHER PUBLICATIONS

Jean-Ho Song et al., "Views on the low-resistant bus materials and their process architecture for the large-sized & post-ultra definition TFT-LCD", IMID/IDMC/Asia Display Digest, pp. 9-pp. 12 (2008).

\* cited by examiner

*Primary Examiner* — Margaret Moore
(74) *Attorney, Agent, or Firm* — Mitchell Brustein

(57) ABSTRACT

A positive-type photosensitive siloxane composition which comprises (I) two or more polysiloxanes that differ in the rate of dissolution in aqueous tetramethylammonium hydroxide (TMAH) solutions, (II) a polysiloxane that gives a film which after prebaking has a rate of dissolution in 2.38 wt-% aqueous TMAH solution of 50-1,000 Å/sec and that has a group soluble in aqueous TMAH solution, other than silanol, (III) a diazonaphthoquinone derivative, and (IV) a solvent.

15 Claims, 2 Drawing Sheets

POSITIVE-TYPE PHOTOSENSITIVE SILOXANE COMPOSITION

This application is a United States National Stage Patent Application under 35 U.S.C. §371 of International Patent Application No. PCT/JP2013/080761, filed Nov. 14, 2013, which claims priority to Japanese Patent Application No. 2012-256754, filed Nov. 22, 2012, the contents of which are being hereby incorporated herein by reference.

TECHNICAL FIELD

The present invention relates to a positive-type photosensitive siloxane composition, more specifically, to a positive-type photosensitive siloxane composition which is able to form an optically transparent pattern with a resistance for a high temperature, a high chemical resistance, a high resistance for environment, and reduced pattern defects due to development residues, an undissolved residual layer, re-adhesion of slightly soluble materials at a development, and the like, and which is suitably used for a planarization film for a substrate of a thin film transistor (TFT) used in a back plane of displays such as a liquid crystal display element and an organic EL display element, and an interlayer insulator for a semiconductor element as well as elements such as a solid-state image sensing device, an antireflective film, an antireflective plate, an optical filter, a high luminance luminous diode, a touch panel, a solar cell, optical devices such as an optical waveguide, and so on. Further, the present invention relates to a cured film formed by using this positive-type photosensitive siloxane composition.

BACKGROUND ART

In recent years, various proposals for further improvement of the light utilization efficiency and the energy saving in optical elements such as displays, light-emitting diodes, and solar cells have been made. For example, it has been known in a liquid crystal display to raise an aperture ratio of the display device by forming a transparent planarization film by application on a TFT element and then forming pixel electrodes on the planarization film (see the patent document 1 below). Further, in an organic EL device, it was also proposed to raise an aperture ratio thereof like a liquid crystal display by adopting a method for extracting light emitted by a luminous layer, which exists on a planarization layer formed on a TFT element by application, from the opposite side of the TFT element (a top emission method) instead of a method for extracting light emitted by a luminous layer, which is formed by vapor deposition on a transparent pixel electrode formed on a substrate, from the substrate side (a bottom emission method) (see the patent document 2 below).

Furthermore, delay in signal on wiring becomes a problem accompanying to high resolution, increasing size, high image quality, and 3D indication of a display. An incoming signal to a TFT becomes shorter by increasing of writing speed of an image data (frame frequency) but extension of the wiring width for lowering a wiring resistance is limited from a demand of high resolution. Because of this, it was proposed to solve the problem of signal delay by increasing the thickness of the wiring (see the non-patent document 1 below).

As materials of the planarization film for the TFT substrate, there has been known a material which comprises an acrylic resin and a quinonediazide compound (see the patent documents 3 and 4 below). Though properties of the material do not deteriorate sharply at a high temperature of 200° C. or more, decomposition thereof begins gradually at a high temperature of 230° C. or more and there occur problems such as reduction of a film thickness and lowering of transparency due to coloring of a transparent layer by a high temperature processing of the substrate. This material, therefore, cannot be used particularly in a process for forming a film on a transparent layer at a high temperature with devices such as a PE-CVD. Further, the acrylic material is not a best material for use in a high temperature process or for use to a device influenced by impurities, as decomposition products thereof affect badly to the luminous efficiency and the life of an organic EL element. Furthermore, the acrylic material to which a heat resistance is given has simultaneously a high dielectric constant generally. The material, therefore, has such problems that electricity consumption becomes larger due to the increase in the parasitic capacitance by an insulation film and the image quality decreases due to the delay of a driving signal in a liquid crystal element. Though the capacitance of an insulating material with a large dielectric constant can be made small, for example, by making a film thickness large, it is not preferable to make the film thickness large as it is difficult to form a coating film of e.g. 5 µm or more in thickness with a uniform film thickness on a large glass substrate by a slit coating method etc. generally and the amount of the material used becomes large.

The polysiloxane, in particular, silsesquioxanes is known as a material with a high thermal resistance and a high transparency. Though the silsesquioxane is a polymer constructed by a three-functional siloxane structure unit: $RSi(O_{1.5})$ and is in between an inorganic silica ($SiO_2$) and an organic silicone ($R_2SiO$) with respect to the chemical structure, it is a singular compound as it is soluble in an organic solvent but the cured material thereof shows a high thermal resistance which is a characteristic of inorganic silica. Furthermore, as the polymer having a siloxane skeleton has a low dielectric constant compared to organic polymers generally, it is expected as a material for a transparent insulation film with a low dielectric constant. When the polysiloxane is used as a component of a photosensitive composition, it is necessary that the polysiloxane is soluble in a developer such as a tetramethylammonium hydroxide aqueous solution. Therefore, there was proposed a photosensitive composition comprising an acrylic copolymer which is formed by copolymerizing a silsesquioxane compound, in which an acrylic group is given to a particular cage-type silsesquioxane, with an unsaturated carboxylic acid, an unsaturated compound containing an epoxy group, and an olefinic unsaturated compound, and a quinonediazide compound (see the patent document 5 below). However, the composition comprising a complicated system described above gives a cured material with an insufficient thermal resistance due to the thermal deterioration of organic compounds except for the polysiloxane, as the amount of the organic compounds is large. In addition, the problems of coloration and gas generation due to the decomposition cannot be ignored.

As a photosensitive composition comprising the polysiloxane and the quinonediazide, there was proposed a photosensitive composition comprising, for example, a combination system of a polysiloxane insoluble in a developer and a polysiloxane soluble in a developer and a quinonediazide compound, by which a 'pattern' sagging, that is, the deterioration of the resolution caused by flowing of developed hole or line patterns at a heat curing, was prevented (see the patent document 6 below). However, when a polysiloxane insoluble in a developing solution is used, it will cause generation of a development pattern defect due to undissolved residues after development or re-adhesion of insoluble materials eluted into the developing solution during the development.

As methods for retaining solubility of the polysiloxane in a developing solution by a group except a silanol group, there were proposed a method of acylating a part of phenyl groups in phenylpolysiloxane (see the patent document 7 below) and a method of using a cage-type silsesquioxane compound having a quinonediazide structure (see the patent document 8 below). As these siloxanes have stable developer-soluble groups, even if a silanol group reacted during development, problems of generating an undissolved layer and undissolved residues are reduced. However, as the cured materials of these polysiloxanes have poor resistance for chemicals such as a stripper for photoresist, usable uses will be limited.

By the way, when a photosensitive siloxane composition containing a diazonaphthoquinone derivative as a dissolution inhibitor is developed using a 2.38 wt-% tetramethylammonium hydroxide (hereinafter, refer to "TMAH") aqueous solution as a developer, it is possible to form a practical positive pattern after exposure and development if the rate of dissolution in a 2.38 wt-% TMAH aqueous solution of the polysiloxane is 100 Å/second or more. However, a polysiloxane having a silanol group and soluble in a TMAH aqueous solution is a polymer having a relatively low molecular weight and when this polysiloxane is used, the 'pattern' sagging is generally caused in a heat curing process.

The polysiloxane becomes a high molecular weight by the dehydration condensation of silanol groups by heat. This reaction proceeds faster as the temperature is higher. However, it is difficult to control the 'pattern' sagging at a high temperature, as the polysiloxane becomes temporarily a low viscosity at a high temperature.

The 'pattern' sagging can be reduced by increasing a molecular weight of a polysiloxane. However, if the molecular weight of a polysiloxane is increased, the polysiloxane becomes slightly soluble in a 2.38 wt-% TMAH aqueous solution as described in the patent document 6. Therefore, it will cause problems such as deterioration in resolution, low sensitivity, and pattern defects after development. As another method for solving the 'pattern' sagging, there was proposed a method for reducing the 'pattern' sagging despite a low molecular weight material by synthesizing a polysiloxane, which is a polysiloxane having a low dissolution rate in at least two kinds of polysiloxanes having different dissolution rates, in the existence of a basic catalyst (see, the Patent document 9 below). In this method, the rate of dissolution in a 2.38 wt-% TMAH aqueous solution of the polysiloxane mixture is adjusted by changing a mixing ratio of polysiloxanes having different dissolution rates and a positive-type photosensitive composition having a high sensitivity can be obtained.

Generally, in the subsequent development process after the light irradiation process, a relatively long time development from 30 seconds to 120 seconds are performed for controlling a pattern size after development. It is, therefore, necessary to make the dissolution rate slower as the thickness of the film becomes thinner. However, in the method described in the patent document 9, it is necessary to increase an amount of a slightly soluble polysiloxane for delaying the dissolution rate when the thickness of the film is thin or the photosensitive composition is applied to a process in which a long time development is performed. Because of this, there is a problem such that development residues called scum remains.

CITATION LIST

Patent Documents

Patent document 1: JP 2933879 B
Patent document 2: JP 2006-236839 A
Patent document 3: JP 2961722 B
Patent document 4: JP 3783512 B
Patent document 5: JP 2007-119777 A
Patent document 6: JP 2007-193318 A
Patent document 7: JP 2010-043030 A
Patent document 8: JP 2007-293160 A
Patent document 9: WO 2012/026400 A Nonpatent Documents Non-patent document 1: IMID/IDMC/ASIA DISPLAY 2008 Digest, pages 9-12

DISCLOSURE OF THE INVENTION

Problems to be Solved by the Invention

The present invention was made under the aforementioned situation. An object of the present invention is to provide a high sensitive positive-type photosensitive siloxane composition which is able to form a cured pattern with a high resolution, a high heat-resistance, a high chemical resistance, a high transparency, and reduced pattern defects due to development residues, undissolved remains, and re-adhesion of insoluble materials at the formation of a pattern.

Furthermore, another object of the present invention is to provide a cured film used for forming a solid-state image sensing device, an antireflective film, an antireflective plate, an optical filter, a high luminance luminous diode, a touch panel, a solar cell, optical devices such as an optical waveguide, or a planarization film, interlayer insulator, and the like for a semiconductor element etc., which is formed by the aforementioned photosensitive siloxane composition.

Means for Solving the Problems

As a result of intensive studies and investigations, the present inventors found that in a positive-type photosensitive siloxane composition containing a polysiloxane, a diazonaphthoquinone derivative, and a solvent, pattern defects due to development residues, undissolved remains, and re-adhesion of insoluble materials are reduced and a cured film with a high resolution and a good remaining film thickness, which has a high optical transparency, a high heat resistance, a high chemical resistance, and an good environmental tolerance, can be formed at a high sensitivity by use of at least two kinds or more of polysiloxanes which have different dissolution rates in tetramethylammonium hydroxide aqueous solutions and a polysiloxane having a group soluble in a tetramethylammonium hydroxide aqueous solution, other than a silanol group, as polysiloxanes. The invention was accomplished based on these findings.

Namely, the present invention relates to a positive-type photosensitive siloxane composition and a cured film described below.

(1) A positive-type photosensitive siloxane composition comprising (I) at least two kinds or more of polysiloxanes that differ in the rate of dissolution in tetramethylammonium hydroxide aqueous solutions, (II) a polysiloxane having a group soluble in a tetramethylammonium hydroxide aqueous solution, other than a silanol group, (III) a diazonaphthoquinone derivative, and (IV) a solvent, wherein the polysiloxane (I) is a mixture which consists of (A) a polysiloxane (Ia) obtained by hydrolyzing and condensing a silane compound represented by the formula (1):

$$R^1{}_nSi(OR^2)_{4-n} \tag{1}$$

wherein $R^1$ represents a liner, branched or cyclic alkyl group having 1 to 20 carbon atoms, in which any methylene group may be replaced with an oxygen atom, or an aryl group having 6 to 20 carbon atoms, in which any hydrogen atom may be replaced with a fluorine atom, $R^2$ represents an alkyl group having 1 to 5 carbon atoms, and n is 0 or 1, in the presence of a basic catalyst, a film after prebaking of which is soluble in a 5 wt-% tetramethylammonium hydroxide (hereinafter, refer to "5% TMAH") aqueous solution and has a rate of dissolution in the 5% TMAH aqueous solution of 1,000 Å/second or less, and (B) a polysiloxane (Ib) obtained by hydrolyzing and condensing the silane compound represented by the aforementioned formula (1) in the presence of an acidic or basic catalyst, a film after prebaking of which has a rate of dissolution in a 2.38 wt-% tetramethylammonium hydroxide (hereinafter, refer to "2.38% TMAH") aqueous solution of 200 Å/second or more, and a rate of dissolution in a 2.38% TMAH aqueous solution of the mixture is 50 to 1,000 Å/second, and the polysiloxane (II) having a group soluble in a tetramethylammonium hydroxide aqueous solution, other than a silanol group is a polysiloxane, a film after prebaking of which has a rate of dissolution in a 2.38% TMAH aqueous solution of 50 to 1,000 Å/second.

(2) The positive-type photosensitive siloxane composition described in the item (1), wherein the polysiloxane (Ib) contains a polysiloxane (Ib'), a film after prebaking of which has a rate of dissolution in a 2.38% TMAH aqueous solution of 3,000 Å/second or more and/or a polysiloxane (Ib"), a film after prebaking of which has a rate of dissolution in a 2.38% TMAH aqueous solution of 200 to 3,000 Å/second, both of which are obtained by hydrolyzing and condensing a silane compound represented by the aforementioned formula (1), wherein $R^1$ represents a liner, branched or cyclic alkyl group having 1 to 20 carbon atoms, in which any methylene group may be replaced with an oxygen atom, or an aryl group having 6 to 20 carbon atoms, in which any hydrogen atom may be replaced with a fluorine atom, $R^2$ represents an alkyl group having 1 to 5 carbon atoms, and n is 0 or 1, in the presence of an acidic or basic catalyst.

(3) The positive-type photosensitive siloxane composition described in the item (1), wherein the positive-type photosensitive siloxane composition contains at least a polysiloxane (Ia) and a polysiloxane (Ib") and is used as a film of 1.5 μm or less in thickness.

(4) The positive-type photosensitive siloxane composition described in any one of the items (1) to (3), wherein the polysiloxane (II) having a group soluble in a tetramethylammonium hydroxide aqueous solution, the film after prebaking of which has a rate of dissolution in a 2.38% TMAH aqueous solution of 50 to 1,000 Å/second or more, is obtained by hydrolyzing and condensing at least one kind of a silanol compound represented by the formula (2) described below in the presence of an acidic or basic catalyst.

Formula (2):

$$R^3Si(OR^4)_3 \tag{2}$$

Wherein, $R^3$ represents a group having at least one group $R^3a$ soluble in a 2.38% TMAH aqueous solution, $R^3a$ represents a phenolic hydroxyl group, a carboxylic acid group or a salt thereof, a carboxylic anhydride group, a sulfonic aid group or a salt thereof, a thiol group, a cyano group, or —CO—$R^7$ (wherein $R^7$ represents a hydrogen atom or an alkyl, alkenyl or alkoxy group having 1 to 5 carbon atoms), and $R^4$ represents an alkyl group having 1 to 5 carbon atoms.

(5) The positive-type photosensitive siloxane composition described in the item (4), wherein the polysiloxane (II) is obtained from at least one kind of a silane compound represented by the formula (2) above and at least one kind of a silane compound represented by the following formula (3).

Formula (3):

$$R^5Si(OR^6)_3 \tag{3}$$

Wherein, $R^5$ represents a methyl group or a phenyl group and $R^6$ represents an alkyl group having 1 to 5 carbon atoms.

(6) The positive-type photosensitive siloxane composition described in the item (4) or (5), wherein $R^3$ is a group represented by the following formula (4).

Formula (4):

$$—X-M-R^3a \tag{4}$$

Wherein, X represents a single bond or an alkylene group having 1 to 10 carbon atoms, in which one —CH$_2$— may be replaced with —CH=CH—, —O—, —CO— or —COO—, M represents a single bond, an cyclic alkyl group having 5 to 10 carbon atoms, a phenyl group or a naphthalene group which may have a subsituent, $R^3a$ represent a phenolic hydroxyl group, a carboxylic acid group or a salt thereof, a carboxylic anhydride group, a sulfonic aid group or a salt thereof, a thiol group, a cyano group, or —CO—$R^7$ (wherein, $R^7$ represents a hydrogen atom or an alkyl, alkenyl, or alkoxy group having 1 to 5 carbon atoms), and is a group selected from a carboxylic acid group or a salt thereof, a carboxylic anhydride group, a sulfonic aid group or a salt thereof, a thiol group, and a cyano group when M is a cyclic alkyl group or a group selected from a hydroxyl group, a carboxylic acid group or a salt thereof, a carboxylic anhydride group, a sulfonic aid group or a salt thereof, a thiol group, and a cyano group when M is a phenyl group or a naphthalene group. Furthermore, $R^3a$ may be multiply-substituted to M and in that case, the mutual $R^3a$'s may be the same or different from each other.

(7) The positive-type photosensitive siloxane composition described in the item (5), wherein the polysiloxane (II) is a polysiloxane represented by the following structure.

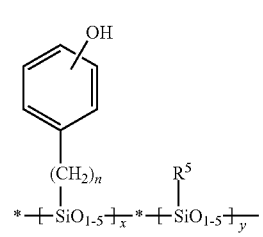

(5)

Wherein, $R^5$ represents a methyl group or a phenyl group, n is 0 to 10 (but one —CH$_2$— in an alkylene group may be replaced with —CH=CH—, —O—, —CO— or —COO—), x and y represent a copolymerization ratio (mole-%), and x:y is from 10:90 to 90:10.

(8) The positive-type photosensitive siloxane composition described in the item (5), wherein the polysiloxane (II) is a polysiloxane represented by the following structure.

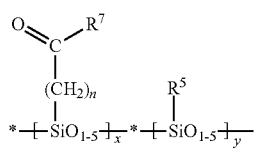

(6)

Wherein, $R^5$ represents a methyl group or a phenyl group, $R^7$ represents a hydrogen atom or an alkyl, alkenyl or alkoxy group having 1 to 5 carbon atoms, n is 0 to 10 (but one —CH$_2$— in an alkylene group may be replaced with —CH=CH—, —O—, —CO— or —COO—), x and y represent a copolymerization ratio (mole-%), and x:y is from 10:90 to 90:10.

(9) The positive-type photosensitive siloxane composition described in any one of the items (1) to (8), wherein the blending amount of the polysiloxane (II) is 0.1 to 5.0 weight parts based on 100 weight parts of the polysiloxane (1).

(10) A cured film which is formed from the positive-type photosensitive siloxane composition described in any one of the items (1) to (9).

Advantageous Effects of the Invention

The positive-type photosensitive siloxane composition of the present invention has a high sensitivity and a high resolution. In addition, the cured film obtained from the composition has a good heat-resistance, a high transparency, a good remaining film thickness, and reduced pattern defects due to development residues, undissolved remains, and re-adhesion of insoluble materials at development. In addition to these, as the planarization and electric insulation of the film are superior, the composition can be used suitably as various film forming materials for a planarization film for a substrate of a thin film transistor (TFT) used in a back plane of displays such as a liquid crystal display element and an organic EL display element, an interlayer insulator of a semiconductor element, and an insulator film or transparent protective film of a solid-state image sensing device, an antireflective film, an antireflective plate, an optical filter, a high luminance luminous diode, a touch panel, a solar cell, and so on as well as optical devices such as an optical waveguide.

MODE FOR CARRYING OUT THE INVENTION

Figure 1:
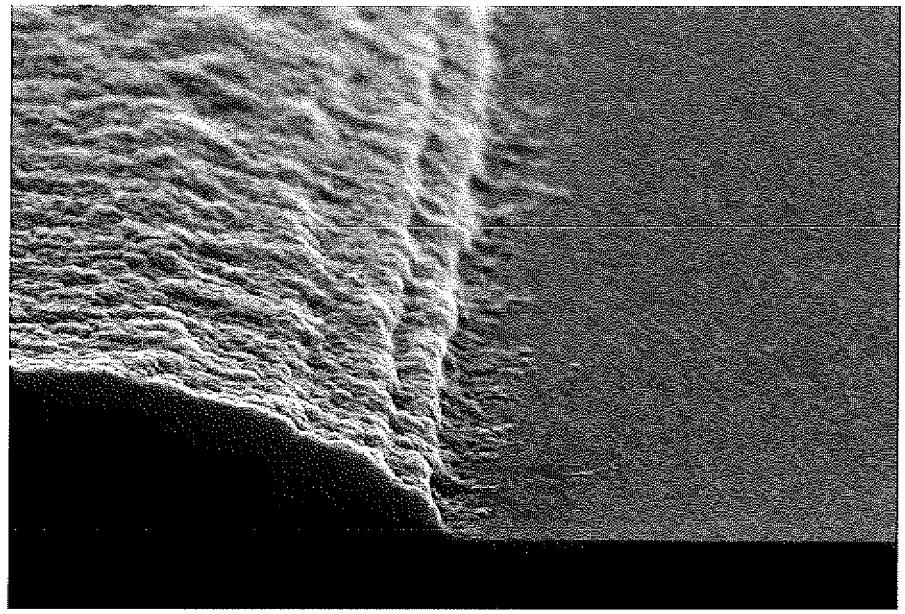
FIG. 1 is a SEM photomicrograph of a 5 μm line and space (L/S) pattern obtained in Example 5, which is formed by developing a positive-type photosensitive siloxane composition of 0.5 μm in thickness with a 2.38% TMAH aqueous solution.

Hereinafter, the positive-type photosensitive siloxane composition of the present invention will be more specifically explained.

The positive-type photosensitive siloxane composition of the present invention is characterized by comprising a polysiloxane (I) consisting of at least two kinds or more of polysiloxanes which have different dissolution rates in tetramethylammonium hydroxide aqueous solutions, a polysiloxane (II) having a group soluble in a tetramethylammonium hydroxide aqueous solution, other than a silanol group, a diazonaphthoquinone derivative (III), and a solvent (IV). These polysiloxanes, the diazonaphthoquinone derivative, and the solvent, which are used in the positive-type photosensitive polysiloxane composition of the present invention, will be explained in detail in order below.

(I) Polysiloxane Consisting of at Least Two Kinds or More of Polysiloxanes which have Different Dissolution Rates in Tetramethylammonium Hydroxide Aqueous Solutions In the present invention, the polysiloxane (I) is characterized by combining at least two kinds or more of polysiloxanes which have different dissolution rates in tetramethylammonium hydroxide aqueous solutions, namely combining a polysiloxane having a low dissolution rate in a 2.38% TMAH aqueous solution with a polysiloxane having a relatively high dissolution rate in a 2.38% TMAH aqueous solution. As the polysiloxane having a low dissolution rate in a 2.38% TMAH aqueous solution, there is used a polysiloxane (Ia) which is slightly soluble in a 2.38% TMAH aqueous solution and is prepared by hydrolyzing and condensing a silane compound represented by $R^1{}_n Si(OR^2)_{4-n}$ of the formula (1) in the presence of a basic catalyst, and the film after prebaking of which is soluble in a 5% TMAH aqueous solution and has a rate of dissolution in a 5% TMAH aqueous solution of 1,000 Å/second or less. The polysiloxane (Ia) may be used singly or in combination of two or more kinds thereof.

On the other hand, as the polysiloxane having a relatively high dissolution rate in a 2.38% TMAH aqueous solution, a polysiloxane (Ib) prepared by hydrolyzing and condensing a silane compound represented by the aforementioned formula (1) in the presence of an acidic or basic catalyst, the film after prebaking of which has a rate of dissolution in a 2.38% TMAH aqueous solution of 200 Å/second or less, is used. The polysiloxane (Ib) may be used singly or in combination of two or more kinds thereof.

In the polysiloxane (I) of the present invention, for reducing undissolved remains, the polysiloxane (Ib) may be made to a polysiloxanes consisting of a polysiloxane (Ib'), a film after prebaking of which has a rate of dissolution in a 2.38% TMAH aqueous solution of at least 3,000 Å/second or more, and/or a polysiloxane (Ib"), a film after prebaking of which has a rate of dissolution in a 2.38% TMAH aqueous solution of 200 to 3,000 Å/second, both of which are obtained by hydrolyzing and condensing a silane compound represented by the aforementioned formula (1) (in the formula, $R^1$ represents a liner, branched or cyclic alkyl group having 1 to 20 carbon atoms, in which any methylene group may be replaced with an oxygen atom, or an aryl group having 6 to 20 carbon atoms, in which any hydrogen atom may be replaced with a fluorine atom, $R^2$ represents an alkyl group having 1 to 5 carbon atoms, and n is 0 or 1) in the presence of an acidic or basic catalyst. When the film thickness is 1.5 µm or less, it is particularly preferred that the polysiloxane (I) comprises the polysiloxane (Ia) and the polysiloxane (Ib").

If the rate of dissolution in a 2.38% TMAH aqueous solution of the mixture of at least 2 kinds or more of polysiloxanes, which have different dissolution rates in a TMAH aqueous solution, is 50 to 1,000 Å/second, the mixture can compose the positive-type photosensitive siloxane composition which is developed using a 2.38% TMAH aqueous solution as a developer. Therefore, the amounts of at least two kinds or more of polysiloxanes described above, more specifically, the amounts of polysiloxanes (Ia) and (Ib) or polysiloxanes (Ia) and (Ib') or polysiloxanes (Ia), (Ib'), and (Ib") or polysiloxanes (Ia) and (Ib") are set such that the mixtures have the aforementioned rate of dissolution in a 2.38% TMAH aqueous solution of 50 to 1,000 Å/second considering the thickness of the film applied and the dissolution properties of the polysiloxanes (Ia), (Ib'), and (Ib") used.

On the other hand, in the mixture of polysiloxanes (Ia) and (Ib) or polysiloxanes (Ia) and (Ib') or polysiloxanes (Ia), (Ib'), and (Ib") or polysiloxanes (Ia) and (Ib"), when the content of a silica structure of n=0 increases, a crosslink density of polysiloxane obtained increases and a heat sagging phenomenon of 'pattern' becomes to be moderated. Though the polysiloxane (Ia) has a heat-sagging prevention effect of 'pattern', increase of the polysiloxane (Ia) is not preferred from a viewpoint of development residues as the polysiloxane (Ia) contains slightly soluble ingredients. As the heat sagging phenomenon of 'pattern' is moderated by increasing the content of a silica structure as described above, a blending quantity of the polysiloxane (Ia) containing slightly soluble ingredients can be reduced. However, if the content of the silica structure of n=0 increases excessively, the reaction activity of polysiloxane becomes higher and slightly soluble ingredients can be formed during development. From this point, it is preferred that the content of the silica structure of n=0 in the formula (1) in the polysiloxane mixture is set to from 5 mole-% to 30 mole-%. For example, the content of a silica structure of n=0 in polysiloxane (Ia) is preferably 20 mole-% or less, the content of a silica structure of n=0 in polysiloxane (Ib) is preferably 30 mole-% or less, and the content of a silica structure of n=0 in polysiloxanes (Ib') and (Ib") is preferably 30 mole-% or less.

When a pattern is formed using the positive-type photosensitive siloxane composition of the present invention, the positive-type photosensitive siloxane composition is applied on a substrate to form a coated film, followed by exposure to light and development. After the development, the developed film is heated at a temperature of preferably 200° C. or more to forma cured film. At this time, patterns after development sometimes flow. It is, therefore, preferred that the weight ratio of polysiloxane (Ia) to polysiloxane (Ib) is from 30/70 to 70/30, for maintaining a pattern shape by suppressing the heat flow. If the proportion of the polysiloxane (Ia) exceeds 70 weight parts, this composition is not practical as the sensitivity thereof decreases remarkably. Furthermore, it is preferred that the weight ratio of the total amount of polysiloxanes (Ia) and (Ib') to polysiloxane (Ib") is from 95/5 to 50/50, for getting rid of development residues. If the proportion of the polysiloxane (Ib") is 5 weight parts or less, prevention of development residues is not enough. On the other hand, if the proportion thereof is 50 weight parts or more, a problem of a heat flow becomes evident as the proportion of polysiloxane (Ia) in a polysiloxane mixture is not enough.

Furthermore, it is preferred to use a polysiloxane synthesized by using a basic catalyst as the polysiloxane (Ib), as a photosensitive siloxane composition with good 'pattern' sagging prevention effect is formed using the polysiloxane.

Hereinafter, detailed explanations including a synthesis method of the polysiloxanes (Ia) and (Ib) will be given.

As described above, the polysiloxanes (Ia) is obtained by hydrolyzing and condensing the silane compound represented by the formula (1) in the presence of a basic catalyst. On the other hand, the polysiloxane (Ib) is obtained by hydrolyzing and condensing the silane compound represented by the formula (1) in the presence of an acidic or basic catalyst. The polysiloxanes (Ib') and (Ib") which have different dissolution rates in a TMAH aqueous solution are obtained by hydrolyzing and condensing the silane compound represented by the formula (1) in the presence of an acidic or basic catalyst. As the difference of the dissolution rate is controlled by the length of the reaction time when an acidic catalyst is used and by the amount of water added at the time of a reaction when a basic catalyst is used, both of the polysiloxanes (Ia) and (Ib) are prepared by the same procedure described below except for suitably controlling the reaction time or the amount of water. Therefore, if it is not necessary to distinguish the polysiloxane (Ia) and the polysiloxane (Ib) in the explanation below, these will be sometimes called simply "polysiloxane".

In $R^1{}_n Si(OR^2)_{4-n}$ of the formula (1), which is needed for preparing polysiloxanes, $R^1$ represents a liner, branched or cyclic alkyl group having 1 to 20 carbon atoms, in which any methylene group may be replaced with an oxygen atom, or an aryl group having 6 to 20 carbon atoms, in which any hydrogen atom may be replaced with a fluorine atom; $R^2$ represents an alkyl group having 1 to 5 carbon atoms; and n is 0 or 1. The silane compound represented by the formula (1) may be used in combination of two kinds or more thereof.

In the formula (I), examples of the liner, branched or cyclic alkyl group having 1 to 20 carbon atoms, in which any methylene group may be replaced with an oxygen atom, in $R^1$ include a methyl group, an ethyl group, a n-propyl group, an isopropyl group, a t-butyl group, a n-hexyl group, a n-decyl group, a trifluoromethyl group, a 2,2,2-trifluoroethyl group, a 3,3,3-trifluoropropyl group, and a cyclohexyl group. Examples of the aryl group having 6 to 20 carbon atoms, in which any hydrogen atom may be replaced with a fluorine atom, in $R^1$ include a phenyl group and a tolyl group. Of these, the methyl group is preferred as raw materials having this group can be easily available and a film hardness and a chemical resistance of the cured film obtained are high. Further, the phenyl group is also preferred as the group increases solubility in a solvent of a polysiloxane and prevent cracking of the cured film. The methyl group is particularly preferred.

As the alkyl group having 1 to 5 carbon atoms in $R^2$, for example, a methyl group, an ethyl group, a n-propyl group, an isopropyl group, and a n-butyl group are raised. A plurality of $R^2$ in formula (1) may be the same or different from each other. When the silane compound represented by the formula (1) consists of plural compounds, a plurality of $R^2$ in these compounds may be the same or different from each other.

Examples of the silane compound represented by the formula (1) in which n is 1 include, for example, methyltrimethoxysilane, methyltriethoxysilane, methyltriisopropoxysilane, methyltri-n-butoxysilane, ethyltrimethoxysilane, ethyltriethoxysilane, ethyltriisopropoxysilane, ethyltri-n-butoxysilane, n-propyltrimethoxysilane, n-propyltriethoxysilane, n-butyltrimethoxysilane, n-butyltriethoxysilane, n-hexyltrimethoxysilane, n-hexyltriethoxysilane, decyltrimethoxysilane, phenyltrimethoxysilane, phenyltriethoxysilane, trifluoromethyltrimethoxysilane, trifluoroethyltrimethoxysilane, 3,3,3-trifluoropropyltrimethoxysilane, naphthyltrimethoxysilane, naphthyltriethoxysilane, naphthyltriisopropoxysilane, and naphthyltri-n-butoxysilane. Of these, methyltrimethoxysilane, methyltriethoxysilane, phenyltrimethoxysilane, and phenyltriethoxysilane are preferable compounds as being easily available.

Examples of the silane compound represented by the formula (1) in which n is zero include, for example, tetramethoxysilane, tetraethoxysilane, tetrapropoxysilane, and tetrabutoxysilane. Of these, tetramethoxysilane and tetraethoxysilane are preferred as these compounds have a high reactivity.

When the methyl group is used as $R^1$, resistance of the obtained film against a resist remover will be poor if the content of the methyl group in $R^1$ of polysiloxane (I) is small. In contrast, if the content thereof is too large, the activity of siloxane becomes high and it causes the formation of insoluble materials. Therefore, it is preferable that the proportion of a silane compound, where $R^1$ of the formula (1) in polysiloxane (I) is a methyl group, is from 20 mole-% to 80 mole-%. Further, in polysiloxanes (Ia) and (Ib), it is also preferable that at least one of these polysiloxanes has a proportion of a silane compound, which is used for preparing the polysiloxane and in which $R^1$ of the formula (1) is a methyl group, of 20 mole-% to 80 mole-%. Furthermore, in a polysiloxane mixture consisting of the polysiloxane (Ia) and the polysiloxane (Ib), it is also preferable that the proportion of silane compounds, in which $R^1$ is at least a methyl group, in the mixtures is from 20 mole-% to 80 mole-%. Further, it is more preferable that the proportions of silane compounds, in which $R^1$ is a methyl group, in all of the polysiloxanes (Ia), (Ib), and further (Ib') and (Ib") are from 20 mole-% to 80 mole-%.

When the silane compound represented by the formula (1) comprises a plurality of silane compounds, $R^1$'s in these silane compounds may be the same or different from each other. If a silane compound in which $R^1$ is a methyl group is used as one of these silane compounds, it is preferable to use a silane compound, in which $R^1$ is a phenyl group, as other silane compounds represented by the formula (1) together with the silane compound containing a methyl group.

A weight average molecular weight (Mw) of the polysiloxanes (Ia), (Ib), (Ib') and (Ib") is preferably 5,000 or less, more preferably about 1,000 to about 3,000. If the weight average molecular weight thereof is less than 1,000, a 'pattern' sagging prevention effect will become small. On the other hand, if more than 5,000, dissolution residues at development can occur.

The polysiloxane (Ia) and the polysiloxane (Ib), specifically (Ib') and (Ib") can be generally synthesized as follows. That is, a mixture solution of silane compounds represented by the formula (1) is drop-wise added to a mixture solution consisting of an organic solvent, a catalyst, and water to carry out a hydrolysis and condensation reaction. Then, the reaction mixture is neutralized and refined by washing as needed, followed by replacing the reaction solvent to a desired solvent by condensation.

Organic solvent used in the reaction may be used singly or in combination of two kinds or more thereof. Specific examples of the solvent include hydrocarbon solvents such as hexane, toluene, xylene, and benzene; ether solvents such as diethyl ether and tetrahydrofuran; ester solvents such as ethyl acetate; alcohol solvents such as methanol, ethanol, isopropanol, and butanol; and ketone solvents such as acetone, methyl ethyl ketone, and methyl isobutyl ketone. The amount thereof is 0.1 to 10 weight times, preferably 0.5 to 2 weight times the mixture solution of silane compounds.

The dropping and reaction temperatures of the mixture solution of silane compounds are 0° C. to 200° C., preferably 10° C. to 60° C. and these dropping and reaction temperatures may be the same or different from each other. The reaction time is changed by the substituent $R^2$ of the silane compound represented by the formula (1) but is usually from several ten minutes to several ten hours. Conditions at the hydrolysis and condensation reaction such as an amount of a catalyst, a reaction temperature, a reaction time etc. are set considering the scale of reaction, the size and shape of a reaction vessel, and the like. By these, polysiloxanes having suitable properties for an intended use can be obtained.

Examples of the basic catalyst include organic bases such as triethylamine, tripropylamine, tributylamine, tripentylamine, trihexylamine, triheptylamine, trioctylamine, diethylamine, triethanolamine, diethanolamine, and alkoxysilanes having amino group(s); inorganic bases such as sodium hydroxide and potassium hydroxide; anion exchange resins; quaternary ammonium salts such as tetrabutylammonium hydroxide, tetraethylammonium hydroxide, and tetramethylammonium hydroxide; and the like. The amount of the catalyst is preferably 0.0001 to 10 mole times a mixture of silane compounds.

The degree of hydrolysis can be adjusted by the amount of water added when a basic catalyst is used. The amount of water is changed by the kind and amount of silane compounds used, and so on. When the polysiloxane (Ia) is synthesized, it is desirable generally to react water at a ratio of 0.01 to 10 mole times, preferably 0.5 to 0.9 mole times a hydrolysable alkoxy group of the silane compound represented by the formula (1). When the polysiloxane (Ib) is synthesized, it is desirable generally to react water at a ratio of 0.01 to 10 mole times, preferably 0.9 to 2.0 mole times a hydrolysable alkoxy group of the silane compound represented by the formula (1).

After the completion of the reaction, the reaction solution may be neutralized to neutral pH or somewhat acidic side pH with an acidic compound as a neutralizing agent. Examples of the acidic compound include inorganic acids such as phosphoric acid, nitric acid, sulfuric acid, hydrochloric acid, and hydrofluoric acid; organic acids such as acetic acid, trifluoroacetic acid, formic acid, lactic acid, acrylic acid, polyvalent carboxylic acids such as oxalic acid, maleic acid, succinic acid, citric acid, and anhydrides thereof, sulfonic acids such as p-toluenesulfonic acid and methanesulfonic acid etc.; cationic ion-exchange resins; and so on.

The amount of the neutralizing agent is suitably selected according to the pH value of the reaction solution containing a polysiloxane and is preferably 0.5 to 1.5 mole times, more preferably 1 to 1.1 mole times the basic catalyst.

On the other hand, examples of the acidic catalyst include hydrochloric acid, nitric acid, sulfuric acid, hydrofluoric acid, phosphoric acid, acetic acid, trifluoroacetic acid, formic acid, polyvalent carboxylic acids or anhydrides thereof, and ion exchange resins. The amount of the catalyst added, which can be changed by the strength of the acid, is preferably 0.0001 to 10 mole times the amount of a silane compound mixture.

When the acidic catalyst is used, the degree of hydrolysis can be generally adjusted by the mixing time though it varies depending on the kind and amount of silane compounds used. When preparing the polysiloxane (Ib), the mixing time is preferably from 1 hours to 12 hours and when preparing the polysiloxane (Ib") having a fast dissolution rate, the mixing time is preferably from 5 hours to 12 hours, in general.

After the completion of the reaction, the reaction solution may be neutralized as with the case of using a basic catalyst. When an acidic catalyst is used, a basic compound is used as a neutralizer. Examples of the basic compounds used for the neutralization include organic bases such as triethylamine, tripropylamine, tributylamine, tripentylamine, trihexylamine, triheptylamine, trioctylamine, diethylamine, triethanolamine, and diethanolamine; inorganic bases such as sodium hydroxide and potassium hydroxide; anion exchange resins; quaternary ammonium salts such as tetrabutylammonium hydroxide, tetraethylammonium hydroxide, and tetramethylammonium hydroxide; and so on. The amount of the neutralizer is preferably 0.5 to 1.5 mole times, more preferably 1 to 1.1 mole times the amount of an acidic catalyst.

After neutralization, the neutralized solution may be washed and refined according to properties required to the coated film or the shelf life required to the solution. The washing and refining are conducted as follows. That is, a hydrophobic organic solvent and water as needed are added to the neutralized solution followed by mixing and contacting these to dissolve at least a polysiloxane in a hydrophobic organic solvent. As the hydrophobic organic solvent, compounds which can dissolve polysiloxane but are immiscible with water can be used. The term "immiscible with water" means that water and a hydrophobic organic solvent are separated into a water layer and an organic layer when water and the organic solvent are left to stand after mixing sufficiently.

Preferable examples of the hydrophobic organic solvent include ether solvents such as diethyl ether, ester solvents such as ethyl acetate, alcohol solvents such as butanol, ketone solvents such as methyl ethyl ketone and methyl isobutyl ketone, aromatic solvents such as toluene and xylene, and the like. The hydrophobic organic solvent may be the same as or different from the reaction solvent used in the reaction. The solvent may be used singly or in combination of two kinds or more thereof. By washing of the reaction solution, most of the basic catalyst, the acidic catalyst, the neutralizer which were used hitherto, and salts thereof as well as alcohol and water, which are byproducts of the reaction, are contained in the water layer and substantially removed from the organic layer. The washing number may be set suitably according to properties required to a coated film and properties required to the solution such as the shelf life.

The temperature of washing is preferably 0° C. to 70° C., more preferably 10° C. to 60° C. but is not limited to these. Further, the temperature in separation of a water layer and an organic layer is also preferably 0° C. to 70° C., more preferably 10° C. to 60° C. from the viewpoint of shortening the separation time but is not limited to these.

After washing, the resulting hydrophobic organic solution containing a polysiloxane may be used as it is. However, depending on intended purposes, solvent and residual water and alcohol which are byproducts formed in the reaction process may be further removed by condensation. Furthermore, the concentration of the resulting organic solution may be changed or solvent in the resulting organic solution may be replaced with other solvent. The condensation may be conducted under an ordinary pressure (atmospheric pressure) or a reduced pressure and the degree of condensation can be changed arbitrarily by controlling an amount of distillation. The temperature of the condensation is 30 to 150° C., preferably 40 to 100° C. The replacement of solvent may be conducted by adding desired solvent timely and then condensing so that an intended solvent composition can be obtained.

The polysiloxane (Ia) and the polysiloxane (Ib), more specifically (Ib') and (Ib"), which are used in the siloxane resin composition of the present invention, can be prepared by the process described above and the polysiloxane (I) is obtained by mixing these polysiloxanes.

(II) Polysiloxane Having a Group Soluble in a Tetramethylammonium Hydroxide Aqueous Solution Other than a Silanol Group In the present invention, a polysiloxane soluble in a 2.38% TMAH aqueous solution due to a silanol group and a polysiloxane slightly soluble in a 2.38% TMAH aqueous solution are combined so as to become a desired rate of dissolution in a 2.38% TMAH aqueous solution (polysiloxane (I)) and a positive pattern is formed by utilizing a difference in the solubility by photoreaction of the diazonaphthoquinone derivative. However, the silanol group promotes the dehydration condensation reaction to form alkali insoluble materials. These materials are thought to become development residues. Therefore, the development residues can be reduced by use of the polysiloxane (II) having a group soluble in a tetramethylammonium hydroxide aqueous solution, which has a low reactivity with a silanol group in the polysiloxane (I). As the compound, a polysiloxane having a high compatibility with the polysiloxane (I), particularly a polysilsesquioxane compound which is obtained by hydrolysis and condensation of a silane compound represented by the formula (2) described below in the presence of an acidic or basic catalyst is preferred.

$$R^3Si(OR^4)_3 \quad (2)$$

Wherein, $R^3$ represents at least one group having a group ($R^3a$) soluble in a 2.38% TMAH aqueous solution other than a silanol group, $R^3a$ represents a phenolic hydroxyl group, a carboxylic acid group or a salt thereof, a carboxylic anhydride group, a sulfonic aid group or a salt thereof, a thiol group, a cyano group, or —CO—$R^7$, wherein $R^7$ represents a hydrogen atom or an alkyl, alkenyl or alkoxy group having 1 to 5 carbon atoms, and $R^4$ represents an alkyl group having 1 to 5 carbon atoms.

As $R^3$, for example, a group represented by the formula (4) can be raised as a preferable group.

Formula (4):

$$\text{—X-M-}R^3a \quad (4)$$

Wherein, X represents a single bond or an alkylene group in which one —$CH_2$— may be replaced with —CH=CH—, —O—, —CO— or —COO—, M represents a single bond or an cyclic alkyl group having 5 to 10 carbon atoms, a phenyl group or a naphthalene group, which may have a substituent, $R^3a$ represents a phenolic hydroxyl group, a carboxylic acid group or a salt thereof, a carboxylic anhydride group, a sulfonic acid group or a salt thereof, a thiol group, a cyano group, or —CO—$R^7$ (wherein $R^7$ represents a hydrogen atom or an alkyl, alkenyl or alkoxy group having 1 to 5 carbon atoms), and is a group selected from a carboxylic acid group or a salt thereof, a carboxylic anhydride group, a sulfonic aid group or a salt thereof, a thiol group or a cyano group when M is a cyclic alkyl group, and a group selected from a hydroxyl group, a carboxylic acid group or a salt thereof, a carboxylic anhydride group, a sulfonic aid group or a salt thereof, a thiol group, or a cyano group when M is a phenyl group or a naphthalene group.

As -M-R$^3$a, for example, following groups, in which M is a Phenyl group, are cited.

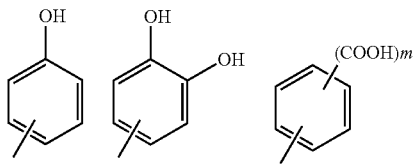

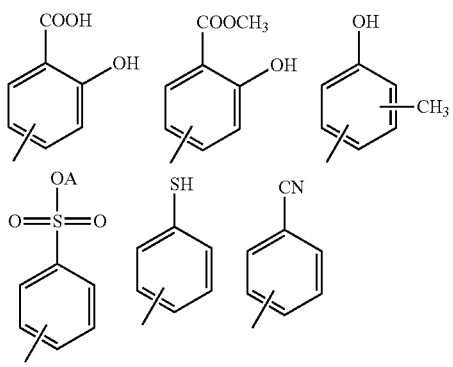

In the formulae described above, m is an integer of 1 or 2 and A represents a hydrogen atom or an ammonium ion.

The polysiloxane (II) having a group soluble in a tetramethylammonium hydroxide aqueous solution other than a silanol group is prepared using at least one kind of silane compound represented by the formula (2) described above and the rate of dissolution in a 2.38% TMAH aqueous solution of a film after prebaking is 50 to 1,000 Å/second, preferably 100 to 1,000 Å/second. At that time, it is more preferable that the polysiloxane (II) is a polysiloxane obtained by hydrolyzing and condensing at least one kind of the silane compound represented by the formula (2) described above and at least one kind of a siloxane compound represented by the formula (3) described below and not having a group soluble in a tetramethylammonium hydroxide aqueous solution, in the presence of an acidic or basic catalyst.

Formula (3):

Wherein, R$^5$ represents a methyl group or a phenyl group and R$^6$ represents an alkyl group having 1 to 5 carbon atoms.

A preferable example of the polysiloxane (II) prepared from the silane compound represented by the formula (2) and the silane compound represented by the formula (3), which is used in the present invention, includes a polysilsesquioxane having the following structure. The polysilsesquioxane may be used singly or in combination of two kinds or more thereof.

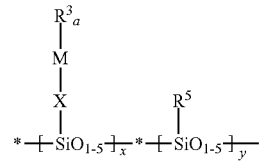

Wherein, X, M, R$^3$a, and R$^5$ are the same as above and x and y represent a copolymerization ratio (mole %).

In the formula (7), a compound in which M is a phenyl group is particularly preferred. Typical examples thereof include polysiloxanes represented by the following formulae.

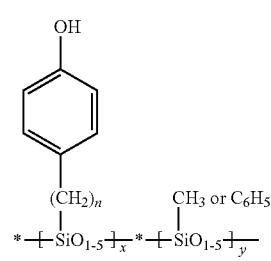

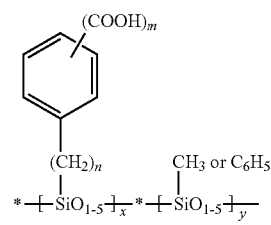

Wherein, m is 1 or 2.

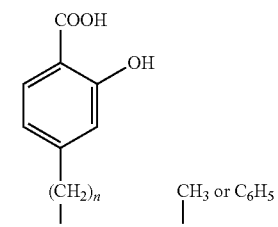

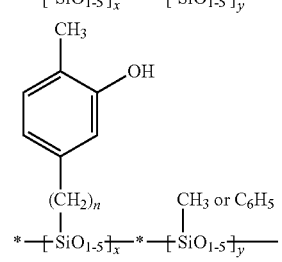

-continued

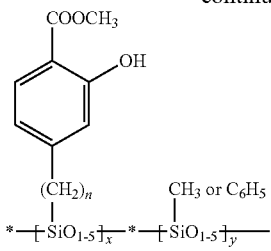

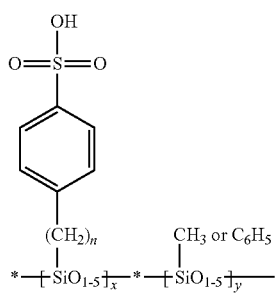

As other preferable structures, there are exemplified compounds where $R^3a$ is —C(O)—$R^7$, in which $R^7$ is a hydrogen atom or an alkyl, alkenyl or alkoxy group having 1 to 5 carbon atoms.

Of these, the following structure, wherein $R^5$ is a methyl group or a phenyl group, is particularly preferred.

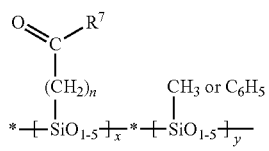

In the formula, $R^7$ represents a hydrogen atom or an alkyl or alkoxy group having 1 to 5 carbon atoms, n is an integer of 0 to 10, one —$CH_2$— in an alkylene group represented by —$(CH_2)_n$— may be replaced with —CH═CH—, —O—, —CO— or —COO—, and x and y represent a copolymerization ratio (mole-%).

$R^7$ is preferably an alkyl group such as a methyl group, an ethyl group, a n-propyl group, a n-butyl group, a n-pentyl group, an isopropyl group, and an isobutyl group, an alkenyl group such as a vinyl group, and alkoxy group such as a methoxy group, an ethoxy group, a n-propoxy group, a n-butoxy group, a n-pentoxy group, an isopropoxy group, and an isobutoxy group. These groups are substituted by an alkyl group and the like.

Specific examples thereof are as follows.

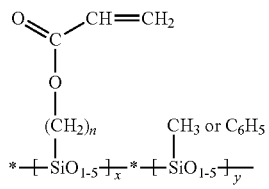

-continued

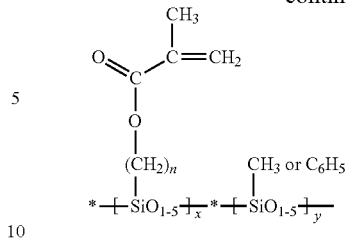

In the formulae described above, the ratio of x and y may be changed such that a rate of dissolution in a 2.38% TMAH aqueous solution of the polysiloxane (II) becomes 50 to 1,000 Å/second and x:y is preferably from 10:90 to 90:10. Furthermore, it is particularly preferable that x is from 50 mole-% to 90 mole-% and y is from 10 mole-% to 50 mole-%.

The polysiloxane (II) can be prepared by the same way as polysiloxanes (Ia) and (Ib) of polysiloxane (I).

The blending amount of the polysiloxane (II) is preferably 0.1 to 5.0 weight parts based on 100 weight parts of polysiloxane (I).

In addition, as a 2.38% TMAH aqueous solution is generally used as a developer at the present time, the dissolution rates of polysiloxanes (Ib) and (II) were set in the aforementioned ranges. However, if an aqueous solution having different TMAH concentrations from the 2.38% TMAH aqueous solution are used as a developer, the same effect as the present invention can be obtained when dissolution rates of polysiloxane (Ib) and polysiloxane (II) are set such that the same dissolution rate ranges as those when a 2.38% TMAH aqueous solution was used can be obtained. Furthermore, the same will apply when inorganic alkali except for TMAH such as sodium hydroxide are used.

(Measurement and Calculation Method of Alkali Dissolution Rate (ADR))

The dissolution rate of the polysiloxanes (Ia), (Ib), and (II) and a mixture thereof in a TMAH aqueous solution is measured and calculated as follows.

First, a polysiloxane is diluted with and dissolved in propylene glycol monomethyl ether acetate (PGMEA) so as to become a concentration of about 35 wt-%. The solution is spin-coated onto a silicon wafer such that a dried film thickness thereof becomes about 2 to 3 μm and then the film is heated on a hot plate at 100° C. for 60 seconds to further remove solvent in the film. The thickness of the coated film is measured using a spectroscopic ellipsometer manufactured by Woolliam Co. Next, the silicon wafer, on which the coated film is carried, is immersed in a 5% TMAH aqueous solution in case of polysiloxane (Ia) and in a 2.38% TMAH aqueous solution in case of polysiloxanes (Ib) and (II), a mixture of polysiloxanes (Ia) and (Ib), and a mixture of polysiloxanes (I) and (II) at a room temperature (25° C.) and the times until the film disappears are measured. The dissolution rate is calculated by dividing the initial film thickness by the time until the film disappears. When the dissolution rate is remarkably slow, a film thickness after immersion for a predetermined time is measured and the dissolution rate is calculated by dividing a variation amount of a film thickness before and after immersion by an immersion time.

(III) Diazonaphthoquinone Derivative

The diazonaphthoquinone derivative used in the photosensitive siloxane composition of the present invention is a compound in which naphthoquinonediazidesulfonic acid is ester-linked to a compound having a phenolic hydroxyl group. The structure thereof is not limited particularly but an ester compound with a compound having one or more of phenolic hydroxyl groups is preferable. As the naphthoquinonediazidesulfonic acid, 4-naphthoquinonediazidesulfonic acid and 5-naphthoquinonediazidesulfonic acid can be used. A 4-naphthoquinonediazidesulfonic acid ester compound is suitable for an i-line (wave length: 365 nm) exposure as it has a light absorption in an i-line area. A 5-naphthoquinonediazidesulfonic acid ester compound is suitable for exposure at a wide wavelength area as its light absorptions exist in a wide wavelength area. It is, therefore, preferable to select a 4-naphthoquinonediazidesulfonic acid ester compound or a 5-naphthoquinonediazidesulfonic acid ester compound according to the wavelength of radiation used for exposure. The mixture of a 4-naphthoquinonediazidesulfonic acid ester compound and a 5-naphthoquinonediazide sulfonate compound may be used.

The compound having one or more of phenolic hydroxyl groups, which is used for forming the diazonaphthoquinone derivative of the present invention, may be a compound having one or more of phenolic hydroxyl group and the structure of the derivative is not limited particularly. Examples of the compound having one or more of phenolic hydroxyl groups include, for example, following compounds. Names given to the exemplified compounds are trade names of HONSHU CHEMICAL CO., LTD except for bisphenol A.

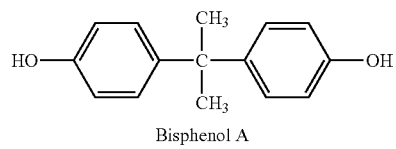
Bisphenol A

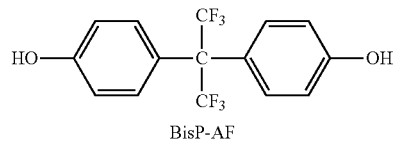
BisP-AF

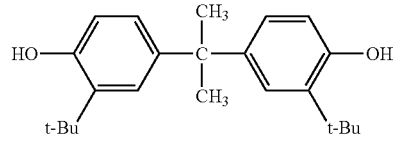
BisOTBP-A

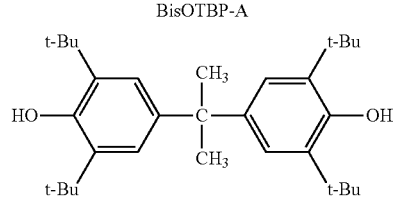
Bis26B-A

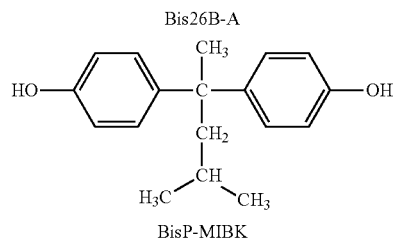
BisP-MIBK

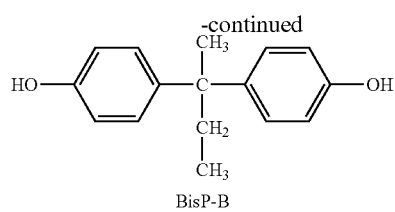
BisP-B

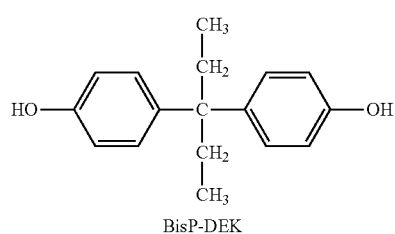
BisP-DEK

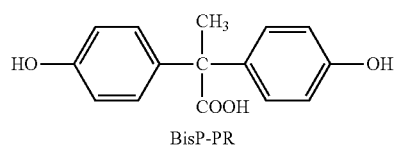
BisP-PR

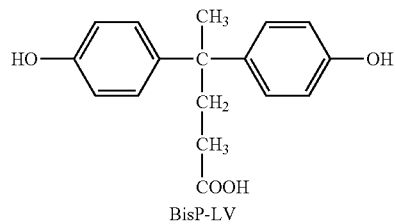
BisP-LV

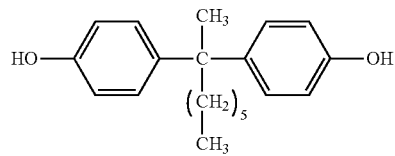
BisP-OT

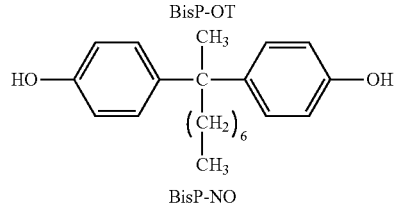
BisP-NO

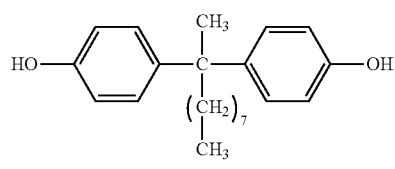
BisP-DE

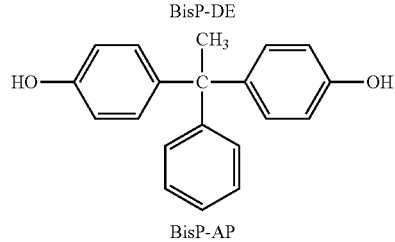
BisP-AP

-continued

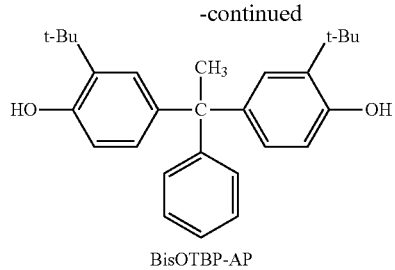
BisOTBP-AP

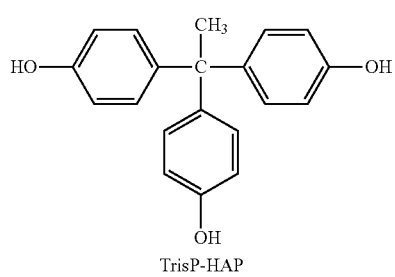
TrisP-HAP

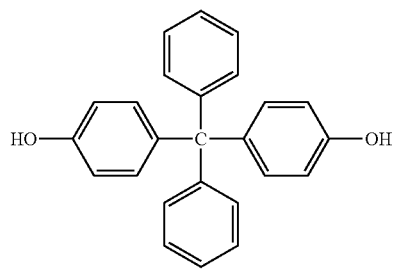
BisP-DP

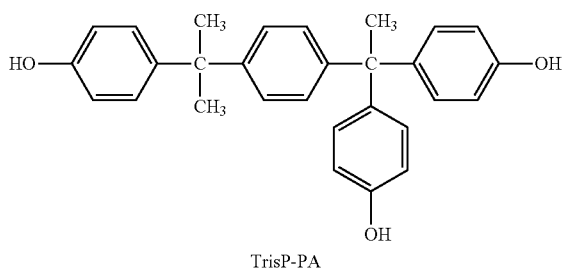
TrisP-PA

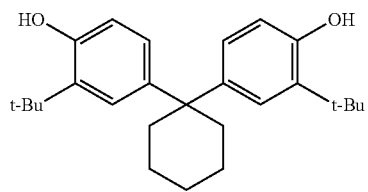
BisOTBP-Z

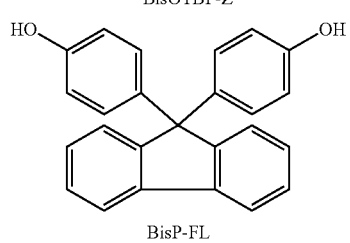
BisP-FL

-continued

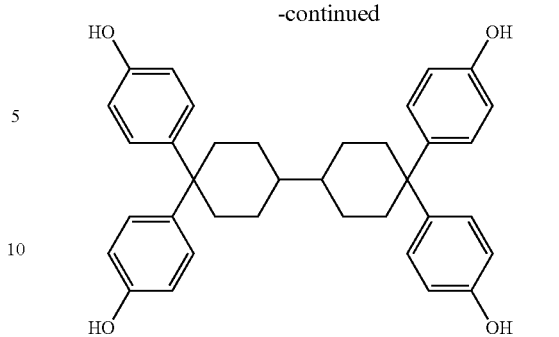
TekP-4HBP

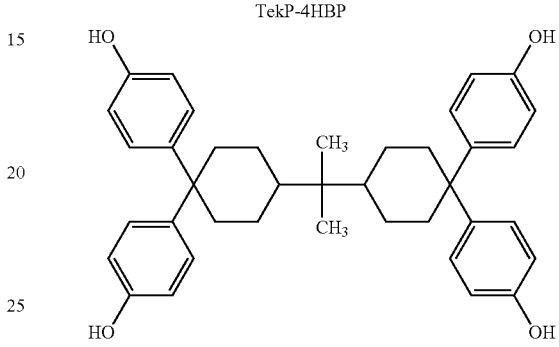
TekP-4HBPA

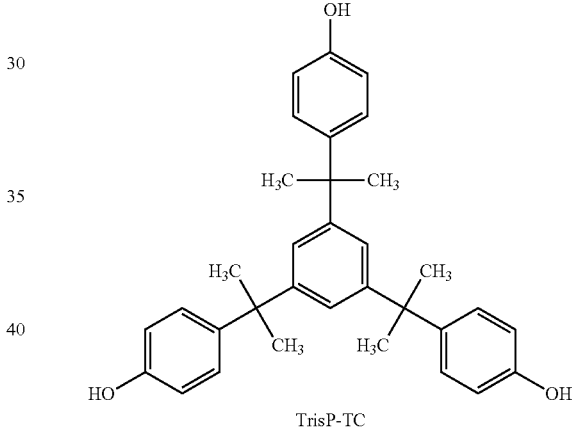
TrisP-TC

The amount of the diazonaphthoquinone derivative added is depending on the esterification rate of naphthoquinone-diazidesulfonic acid, physical properties of polysiloxane used, sensitivities required, and a dissolution contrast between an exposed part and an unexposed part, but is preferably 3 to 20 wt-%, more preferably 5 to 15 wt-% based on the total weight of polysiloxanes (Ia), (Ib), and (II). If the amount of the diazonaphthoquinone derivative is less than 3 wt-%, the dissolution contrast between an exposed area and an unexposed area is too low and the photosensitive composition does not possess a sensitivity suitable for use. For obtaining a better dissolution contrast, the amount is preferably 8 wt-% or more. On the other hand, if the amount of the diazonaphthoquinone derivative is more than 20 wt-%, whitening of the coated film can occur because of a fall of compatibility between the polysiloxane and the quinonediazide compound or colorlessness and transparency of the cured film can be decreased by high degree coloring of the film by decomposition of the quinonediazide compound, which occurs during the heat curing. Further, the heat resistance of the diazonaphthoquinone derivative is lower than that of polysiloxane. Therefore, when the amount of the diazonaphthoquinone derivative becomes larger, the thermal decomposition thereof causes the deterioration of electric insulation of the cured film and the release of gas. These can become problems in the later steps. In addition, the resistance of the cured film for a photoresist stripper, which contains, for example, monoethanolamine as a main agent, can be decreased.

(IV) Solvent

Examples of solvent include ethylene glycol monoalkyl ethers such as ethylene glycol monomethyl ether, ethylene glycol monoethyl ether, ethylene glycol monopropyl ether, and ethylene glycol monobutyl ether; diethylene glycol dialkyl ethers such as diethylene glycol dimethyl ether, diethylene glycol diethyl ether, diethylene glycol dipropyl ether, and diethylene glycol dibutyl ether; ethylene glycol alkyl ether acetates such as methylcellosolve acetate and ethylcellosolve acetate; propylene glycol alkyl ether acetates such as propylene glycol monomethyl ether acetate (PG-MEA), propylene glycol monoethyl ether acetate, and propylene glycol monopropyl ether acetate; aromatic hydrocarbons such as benzene, toluene, and xylene; ketones such as methyl ethyl ketone, acetone, methyl amyl ketone, methyl isobutyl ketone, and cyclohexanone; alcohols such as ethanol, propanol, butanol, hexanol, cyclohexanol, ethylene glycol, and glycerin; esters such as ethyl 3-ethoxypropionate and methyl 3-methoxypropionate; cyclic esters such as γ-butyrolactone; and so on. These solvents may be used singly or in combination of two or more kinds thereof. The amount of the solvent differs depending on application methods or a film thickness of a coated film required after application.

When the photosensitive siloxane composition is applied by a spray coating method, the proportion of solvent in the photosensitive siloxane composition sometimes becomes 90 wt-% or more. In contrast, when applied by a slit coating method which is adopted in applying a large-sized substrate, the proportion of solvent is usually 60 wt-% or more, preferably 70 wt-% or more. However, the properties of the positive-type photosensitive siloxane composition of the present invention do not change largely by the amount of solvent.

Further, surfactants may be contained in the positive-type photosensitive siloxane composition of the present invention, if necessary. The surfactants are added for improving coating properties, developing properties, etc. As surfactants that can be used in the present invention, nonionic surfactants, anionic surfactants, and amphoteric surfactants are raised.

Examples of the nonionic surfactants include polyoxyethylene alkyl ethers such as polyoxyethylene lauryl ether, polyoxyethylene oleyl ether, and polyoxyethylene cetyl ether, polyoxyethylene fatty acid diesters, polyoxyethylene fatty acid monoesters, polyoxyethylene polyoxypropylene brock polymer, acetylene alcohols, acetylene glycols, polyethoxylates of acetylene alcohol, acetylene glycol derivatives such as polyethoxylate of acetylene glycol, fluorine atom-containing surfactants such as Fluorad (trade name, manufactured by Sumitomo 3M), Megafac (trade name, manufactured by DIC Corporation), and Sulflon (trade name, manufactured by ASAHI GLASS CO., LTD.), organic siloxane surfactants such as KP341 (trade name, manufactured by Shin-Etu Chemical Co., Ltd.), and so on. As the acetylene alcohols and acetylene glycols, there are exemplified 3-methyl-1-butyne-3-ol, 3-methyl-1-pentyne-3-ol, 3,6-dimethyl-4-octyne-3,6-diol, 2,4,7,9-tetramethyl-5-decyne-4,7-diol, 3,5-dimethyl-1-hexyne-3-ol, 2,5-dimethyl-3-hexyne-2,5-diol, and 2,5-dimethyl-2,5-hexanediol.

Furthermore, examples of the anionic surfactant include an ammonium salt or organic amine salt of alkyldiphenyl ether disulfonic acid, an ammonium salt or organic amine salt of alkyldiphenyl ether sulfonic acid, an ammonium salt or organic amine salt of alkylbenzenesulfonic acid, an ammonium salt or organic amine salt of polyoxyethylene alkyl ether sulfuric acid, and an ammonium salt or organic amine salt of alkylsulfuric acid.

Further, examples of the amphoteric surfactant include 2-alkyl-N-carboxymethyl-N-hydroxyethylimidazolium betaine and lauric acid amide propylhydroxysulfone betaine.

These surfactants can be used singly or in combination of two or more thereof. The blending amount thereof is usually 50 to 2,000 ppm, preferably 100 to 1,000 ppm based on the photosensitive siloxane composition of the present invention.

Further, sensitizers may be contained in the photosensitive siloxane composition of the present invention, if necessary. As sensitizers preferably used in the positive-type photosensitive siloxane composition of the present invention, there are exemplified sensitizing dyes such as coumarins, ketocoumarins, and derivatives thereof, thiopyrylium salts, acetophenones, and the like, more specifically, p-bis(o-methylstyryl)benzene, 7-dimethylamino-4-methylquinolone-2,7-amino-4-methylcoumarin, 4,6-dimethyl-7-ethylaminocoumarin, 2-(p-dimethylaminostyryl)-pyridylmethyl iodide, 7-diethylaminocoumarin, 7-diethylamino-4-methylcoumarin, 2,3,5,6-1H,4H-tetrahydro-8-methylquinolizino-<9,9a,1-gh>-coumarin, 7-diethylamino-4-trifluoromethylcoumarin, 7-dimethylamino-4-trifluoromethylcoumarin, 7-amino-4-trifluoromethylcoumarin, 2,3,5,6-1H,4H-tetrahydroquinolizino-<9,9a,1-gh>coumarin, 7-ethylamino-6-methyl-4-trifluoromethylcoumarin, 7-ethylamino-4-trifluoromethylcoumarin, 2,3,5,6-1H,4H-tetrahydro-9-carboethoxyquinolizino-<9,9a,1-gh>-coumarin, 3-(2'-N-methylbenzimidazolyl)-7-N,N-diethylaminocoumarin, N-methyl-4-trifluoromethylpiperidino-<3,2-g>coumarin, 2-(p-dimethylaminostyryl)-benzothiazolylethyl iodide, 3-(2'-benzimidazolyl)-7-N,N-diethylaminocoumarin, 3-(2'-benzthiazolyl)-7-N,N-diethylaminocoumarin, and pyrylium or thiopyrylium salts represented by the formula described below. It will become possible to expose with cheap light sources such as a high pressure mercury lamp (360 to 430 nm) by addition of the sensitizing dye.

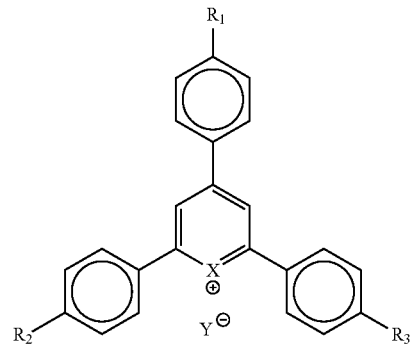

| X | $R_1$ | $R_2$ | $R_3$ | Y |
|---|---|---|---|---|
| S | $OC_4H_9$ | H | H | $BF_4$ |
| S | $OC_4H_9$ | H | H | $BF_4$ |
| S | $OC_4H_9$ | $OCH_3$ | $OCH_3$ | $BF_4$ |
| S | H | $OCH_3$ | $OCH_3$ | $BF_4$ |
| S | $N(CH_3)_2$ | H | H | $ClO_2$ |
| O | $OC_4H_9$ | H | H | $SbF_6$ |

The coated film of the photosensitive siloxane composition of the present invention can be formed by a common coating method, that is, by any one of coating methods known as a photosensitive siloxane coating method, for example, a dip coating method, a roll coating method, a bar coating method, a brush coating method, a spray coating method, a doctor coating method, a flowing and spreading coating method, a spin coating method, a slit coating method, and so on. As a substrate on which a coated film is formed, any substrate such as a silicon substrate, a glass substrate, a resin film, and so on is raised. When the substrate is a film, the application may be conducted by a gravure printing method. A drying process of the coated film may be provided in addition to a coating process, if necessary. The thickness of the coated film can be made to a desired thickness by applying the composition one time or two times or more, as needed.

After forming a coated film of the photosensitive siloxane composition of the present invention, it is preferred to prebake (that is, heat-treat) for drying the coated film and reducing the amount of residual solvent in the coated film herewith. The heating temperature in the prebaking process may be usually 70° C. to 150° C., preferably 90° C. to 120° C. for 10 seconds to 180 seconds, preferably 30 seconds to 90 seconds when heated on a hot plate or for 1 minute to 30 minutes when heated in a clean oven.

Hereinafter a pattern forming method of the positive-type photosensitive siloxane composition of the present invention will be described. Intended patterns are formed by the following steps. First, a coated film of the positive-type photosensitive siloxane composition is formed and prebaked. The film after prebaking pattern-like exposed with a light. As the light source for exposure, lamps such as a high pressure mercury lamp, a low pressure mercury lamp, a metal halide lamp, and a xenon lamp, a laser diode, LED etc. can be used. As the irradiating light, ultraviolet rays such as g-line, h-line, and i-line are used commonly. A Light having wave lengths of 360 to 430 nm (from a high pressure mercury lamp) is commonly used when a patterning with a resolution from several micrometers to dozens micrometers is performed, except for an ultra micro fabrication such as a semiconductor processing. Above all, a light with a wave length of 430 nm is used in many cases in producing a liquid crystal display. In such case, it is advantageous to add a sensitizing dye to the photosensitive siloxane composition of the present invention, as previously stated. Though energy of the irradiation light is changed by a light source used or an initial film thickness of the coated photosensitive siloxane composition, it is set usually between 10 mJ/cm² and 2,000 mJ/cm², preferably between 20 mJ/cm² and 1,000 mJ/cm². When the energy of irradiation light is lower than 10 mJ/cm², the composition does not decompose fully. On the other hand, when the energy is higher than 2,000 mJ/cm², halation can occur by overexposure.

Photo masks utilized generally may be used for the pattern-like irradiation of the positive-type photosensitive siloxane composition of the present invention. These photo masks are well known by persons skilled in the art. Circumstances at the irradiation may be under the atmosphere of an environment (that is, in the air) or the atmosphere of nitrogen gas. Further, in the case of forming a cured film in a whole surface of the coated film, exposure may be conducted after the positive-type photosensitive siloxane composition was applied over a whole surface of the substrate. In the present invention, the meaning of a patterned film includes the case where a cured film is formed in a whole surface.

As a developer used at the time of development in the present invention, any developer conventionally used for developing the photosensitive siloxane compositions can be used. Preferable examples thereof include alkali developers which are aqueous solutions of an alkaline compound such as tetramethylammonium hydroxide, choline, alkali metal hydroxide, (hydrated) metasilicate of alkali metal, (hydrated) phosphate of alkali metal, aqueous ammonia, alkyl amine, alkanol amine, heterocyclic amine or the like. Of these, a tetramethylammonium hydroxide aqueous solution is particularly preferred as the alkali developer. Water-soluble organic solvents such as methanol, ethanol, and the like or surfactants may be contained in the alkali developer. After development with an alkali developer, washing with water is conducted usually. The exposed photosensitive siloxane composition is removed by the washing. After this, when the film is used as a transparent film, it is preferred to conduct an exposure for bleaching. Unreacted diazonaphthoquinone derivatives are photo-decomposed by the bleaching exposure and light transparency of the film is further improved. The bleaching exposure is conducted, for example, by whole exposure of the film at a dose of about 100 to 2,000 mJ/cm² (as a conversion value to an exposure value by a wavelength light of 365 nm) with ultraviolet and visible light exposure equipments such as a PLA.

After development, the coated film is cured by heating the pattern-like exposed film. Heat conditions at curing may be any temperature where the coated film can be cured. The heating temperature is usually 150 to 400° C., preferably 200 to 350° C. When the temperature is lower than 150° C., a sufficient chemical resistance is not shown because unreacted silanol groups remain. Further, polarity of a silanol group induces a high dielectric constant. It is, therefore, preferred to cure the film at a temperature of 200° C. or more when lowering the dielectric constant.

The thus obtained crosslinked cured film has a thermal resistance of 400° C. or more, a light transmittance of 95% or more, and a relative dielectric constant of 4 or less, preferably 3.3 or less. As the film obtained has a higher light transmittance and a lower relative dielectric constant than those of acrylic material so far used, it may be suitably utilized in diverse fields as a planarization film, an interlayer dielectric, and a transparent protective layer for aforementioned various elements, for example, a flat panel display (FPD), or as an interlayer dielectric for a low temperature polysilicon, a buffer coating film for IC chips or the like. Furthermore, the cured materials may be used as materials for an optical device etc.

EXAMPLES

Hereinafter, the present invention will be specifically described with reference to Examples and Comparative examples. However, it should be understood that the present invention is not restricted by these Examples and Comparative examples by no means.

Synthesis Examples

First, Synthesis examples of polysiloxane concerning the present invention will be shown below. In addition, following instruments are utilized for measuring.
GPC: HLC-8220GPC manufactured by TOSOH CORPORATION
Spin coater: MS-A100 manufactured by MIKASA CO, LTD

Synthesis Example 1

Synthesis of Polysiloxane Ia-1; Synthesis with an Alkali Catalyst

To a 2-litre flask equipped with a mixer, a thermometer, and a condenser, 36.5 g of 25 wt-% tetramethylammonium hydroxide (TMAH) aqueous solution, 800 ml of isopropyl alcohol (IPA), and 2.0 g of water were charged. Apart from this, a mixture solution of 39.7 g of phenyltrimethoxysilane, 34.1 g of methyltrimethoxysilane, and 7.6 g of tetramethoxysilane were prepared in a dropping funnel. This mixture solution was added dropwise into the aforementioned flask at 10° C. and then mixed for 3 hours at this temperature. The resulting solution was neutralized by adding 10% KCl aqueous solution. To the neutralized solution, 400 ml of toluene and 100 ml of water were added to separate the mixture solution into two layers. The thus obtained organic layer was concentrated under the reduced pressure to remove solvent and then propylene glycol monomenthyl ether acetate (PGMEA) was added to the concentrate so that the solid concentration thereof becomes 40 wt-%.

The molecular weight (polystyrene conversion) of the thus obtained polysiloxane was 2,200 by weight-average molecular weight (hereinafter, refer to 'Mw') by measuring with GPC. The resin PGMEA solution obtained was applied onto a silicon wafer by a spin coater at 2 μm in thickness after prebaked and the resin film was prebaked. After prebaking, the rate of dissolution (hereinafter, refer to 'ADR') in a 5% TMAH aqueous solution was measured and ADR was 490 Å/second.

Synthesis Example 2

Synthesis of Polysiloxane Ib'-1; Synthesis with an Acid Catalyst

To a 2-litre flask equipped with a mixer, a thermometer, and a condenser, 1.6 g of a 35% HCl aqueous solution, 300 ml of PGMEA, and 27.4 g of water were charged. Apart from this, a mixture solution of 39.7 g of phenyltrimethoxysilane, 34.1 g of methyltrimethoxysilane, and 7.6 g of tetramethoxysilane was prepared in a dropping funnel. This mixture solution was added dropwise into the flask at 10° C. and then mixed for 3 hours at this temperature. To the reaction solution, 200 ml of toluene and 100 ml of water were added to separate the mixture solution into two layers. The thus obtained organic layer was concentrated under the reduced pressure to remove solvent and then propylene glycol monomenthyl ether acetate (PGMEA) was added to the concentrate so that the solid concentration thereof becomes 40 wt-%. The molecular weight (polystyrene conversion) of the thus obtained polysiloxane and ADR in a 2.38% TMAH aqueous solution were measured in the same manner as in Synthesis example 1. Mw was 1,590 and ADR in a 2.38% TMAH aqueous solution was 9,530 Å/second.

Synthesis Example 3

Synthesis of Polysiloxane Ib"-1; Synthesis with an Acid Catalyst

Polysiloxane was synthesized in the same manner as in Synthesis example 2 except that the mixing time after phenyltrimethoxysilane, methyltrimethoxysilane, and tetramethoxysilane were added dropwise was changed to 5 hours. The molecular weight (polystyrene conversion) and ADR in a 2.38% TMAH aqueous solution of the thus obtained polysiloxane were measured in the same manner as in Synthesis example 1. Mw was 1,890 and ADR in a 2.38% TMAH aqueous solution was 2,440 Å/second.

Synthesis Example 4

Synthesis of p-hydroxybenzylsilsesquioxane/methylsilsesquioxane Copolymer II-1; Synthesis with an Acid Catalyst (In the formula 8, n=1, x=70 mole-%, y=30 mole-%, and the insoluble group $R^5$ is a methyl group.)

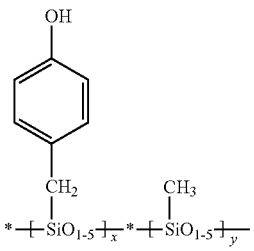

To a 500-milliter 4-necked flask equipped with a mixer, a reflux condenser, a dropping funnel, and a thermometer, 117 g of water was charged and 117 g of toluene solution containing 45.2 g (0.187 mol) of p-methoxybenzyl trichlorosilane and 11.0 g (0.080 mol) of methyltrimethoxysilane was added dropwise at a reaction temperature of 10 to 20° C. After finishing the dropping, the reaction solution was aged at this temperature for 2 hours and then left standing to separate the liquid mixture. The oil layer obtained was collected and washed with a 5% sodium hydrogen carbonate aqueous solution and the toluene oil layer washed was collected. The toluene solution was charged into a 1-liter 4-necked flask equipped with a mixer, a distillation column, a condenser, and a thermometer. The flask was put into an oil bath and heated gradually to distil toluene. After distillation of toluene, the flask was further heated and aged at 200° C. for 2 hours to synthesize 36.6 g of a p-methoxybenzylsilsesquioxane/methylsilsesquioxane copolymer. Then, 215 g of acetonitrile was charged into a 500-milliter 4-necked flask equipped with a mixer, a reflux condenser, a dropping funnel, and a thermometer. To this flask, 36.0 g of a p-methoxybenzylsilsesquioxane/methylsilsesquioxane copolymer, 66.8 g (0.445 mol) of sodium iodide, and 48.4 g (0.445 mol) of trimethylchlorosilane were added sequentially. The resulting mixture was refluxed at a temperature of 65° C. to 70° C. for 24 hours and then 71.7 g of water was added thereto. After this, the solution was refluxed at a temperature of 65° C. to 70° C. for 6 hours followed by cooling. Then, free iodide in the solution was reduced by adding a sodium hydrogen sulfite aqueous solution to the solution. The thus obtained solution was washed two times with a 15% sodium chloride aqueous solution and an oil layer was collected. The oil layer was dropped to water and a crystal formed was recovered and dried. By this, 36.0 g of a p-hydroxybenzylsilsesquioxane/methylsilsesquioxane copolymer with a weight-average molecular weight (Mw: polystyrene conversion) of 5,340 and a degree of dispersion (Mw/Mn: polystyrene conversion) of 1.79 by a GPC analysis was synthesized. ADR in a 2.38% TMAH aqueous solution at a film of 2.6 μm in thickness was 550 Å/second.

Synthesis Example 5

Synthesis of
p-hydroxybenzylsilsesquioxane/phenylsilsesquioxane
Copolymer II-2

(In the formula 8, n=1, x=70 mole-%, y=30 mole-%, and the insoluble group $R^5$ is a phenyl group)

41.1 g of p-hydroxybenzylsilsesquioxane/phenylsilsesquioxane copolymer was synthesized in the same manner as in Synthesis example 4 except for charging 16.9 g of phenyltrimethoxysilane instead of 110 g of methyltrimethoxysilane. By GPC analysis, the weight-average molecular weight (Mw: polystyrene conversion) was 5,240 and the degree of dispersion (Mw/Mn: polystyrene conversion) was 1.76, and ADR in a 2.38% TMAH aqueous solution at a film of 3 μm in thickness was 740 Å/second.

The reaction catalysts used and Mw's and ADRs of polysiloxanes obtained, concerning these Synthesis examples are summarized in Table 1 below.

TABLE 1

| Synthesis example No. | Compound | | Reaction catalyst | Molecular weight (Mw) | ADR (Å/second)/TMAH | |
|---|---|---|---|---|---|---|
| | | | | | 2.38% | 5% |
| 1 | Ia | Ia-1 | Alkali | 2,200 | | 490 |
| 2 | Ib | Ib'-1 | Acid | 1,590 | 9,530 | |
| 3 | Ib | Ib''-1 | Acid | 1,890 | 2,440 | |
| 4 | II | II-1 | Acid | 5,340 | 550 | |
| 5 | II | II-2 | Acid | 5,240 | 740 | |

Example 1

Positive-Type Photosensitive Siloxane Composition

Polysiloxane Ia-1, polysiloxane Ib'-1, and polysiloxane Ib''-1 were mixed at the ratio of 40 wt-% to 30 wt-% to 30 wt-% respectively and then the mixture was prepared to a solution having a concentration of 30% by using PGMEA. To the solution, 12 wt-% of a modified compound of 4-4'-(1-(4-(1-(4-hydroxyphenol)-1-methylethyl)-phenyl)-ethyliden)bisphenol with 2.0 moles of diazonaphthoquinone (refer to 'PAC' below) based on the total weight of polysiloxanes and 1.0 wt-% of polysiloxane II-1 (p-hydroxybenzylsilsesquioxane/methylsilsesquioxane copolymer) based on the polysiloxane were added. Further, 0.3 wt-% of KF-53 manufactured by Shin-Etsu Chemical Co., Ltd. as a surfactant, based on the total weight of polysiloxanes were added thereto to prepare a photosensitive siloxane composition.

The photosensitive siloxane composition was applied onto a silicon wafer by a spin coating followed by prebaking on a hot plate at 100° C. for 90 seconds to prepare a photosensitive siloxane composition layer of 1 μm in thickness. After prebaking, it was exposed with a g- and h-line exposure machine, Nikon FX-604 (NA=0.1) at a dose of 150 mJ/cm$^2$ and then developed with a 2.38% TMAH aqueous solution followed by rinsing with pure water. The patterns obtained were observed with SEM and it was confirmed that 5 μm clear line and space (L/S) patterns and 5 μm clear contact hole (C/H) patterns, which have both no residue, were formed.

Example 2

Positive-Type Photosensitive Siloxane Composition

A photosensitive siloxane composition was prepared in the same manner as in Example 1 except for using polysiloxane II-2 (p-hydroxybenzylsilsesquioxane/phenylsilsesquioxane copolymer) instead of polysiloxane II-1 (p-hydroxybenzylsilsesqioxane/methylsilsesquioxane copolymer). The photosensitive siloxane composition was applied, exposed, developed and rinsed in the same manner as in Example 1. The patterns obtained were observed with SEM and it was confirmed that 5 μm clear line and space (L/S) patterns and 5 μm clear contact hole (C/H) patterns, which have both no residue, were formed.

Example 3

Positive-Type Photosensitive Siloxane Composition

A photosensitive siloxane composition was prepared in the same manner as in Example 1 except for adding 2.0 wt-% of a p-hydroxybenzylsilsesquioxane/methylsilsesquioxane copolymer based on the total weight of polysiloxanes. The photosensitive siloxane composition was applied, exposed, developed and rinsed in the same manner as in Example 1 except for exposing at a dose of 140 mJ/cm$^2$. The patterns obtained were observed with SEM and it was confirmed that 5 μm clear line and space (L/S) patterns and 5 μm clear contact hole (C/H) patterns, which have both no residue, were formed.

Example 4

Positive-Type Photosensitive Siloxane Composition

A photosensitive siloxane composition was prepared in the same manner as in Example 2 except for adding 1.5 wt-% of a p-hydroxybenzylsilsesquioxane/phenylsilsesquioxane copolymer based on the total weight of polysiloxanes. The photosensitive siloxane composition was applied, exposed, developed and rinsed in the same manner as in Example 2. The patterns obtained were observed with SEM and it was confirmed that 5 μm clear line and space (L/S) patterns and 5 μm clear contact hole (C/H) patterns, which have both no residue, were formed.

Example 5

Positive-Type Photosensitive Siloxane Composition

A photosensitive siloxane composition was prepared in the same manner as in Example 1 except for changing the ratio of polysiloxanes to Ia-1:Ib'-1:Ib''-1=25 wt-%:0 wt-%: 75 wt-%, and then preparing a 18 wt-% solution of the polysiloxane mixture with PGMEA, followed by adding 9 wt-% of PAC and 1.5 wt-% of polysiloxane II-1 (p-hydroxybenzylsilsesquioxane/methylsilsesquioxane copolymer) based on the total weigh of polysiloxanes 1a-1 and Ib''-1.

The photosensitive siloxane composition was applied, exposed, developed and rinsed in the same manner as in Example 1 except for preparing the photosensitive siloxane composition layer of 0.5 μm in thickness and exposing at a dose of 200 mJ/cm². The patterns obtained were observed with SEM and it was confirmed that 5 μm clear line and space (L/S) patterns and 5 μm clear contact hole (C/H) patterns, which have both no residue, were formed. A SEM photograph of the line and space (L/S) pattern is shown in FIG. 1.

Example 6

Positive-Type Photosensitive Siloxane Composition

A photosensitive siloxane composition was prepared in the same manner as in Example 1 except for changing the ratio of polysiloxanes to Ia-1:Ib'-1:Ib"-1=30 wt-%:10 wt-%:60 wt-%, the amount of PAC based on the total weight of Ia-1, Ib'-1, and Ib"-1 to 9 wt-%, and the amount of polysiloxane II based on the total weight of Ia-1, Ib'-1, and Ib"-1 to 1.5 wt-%. The photosensitive siloxane composition was applied, exposed, developed and rinsed in the same manner as in Example 1. The developed patterns were observed with SEM and it was confirmed that 5 μm clear line and space (L/S) patterns and 5 μm clear contact hole (C/H) patterns having no residue respectively were formed.

Example 7

Positive-Type Photosensitive Siloxane Composition

Figure 3:
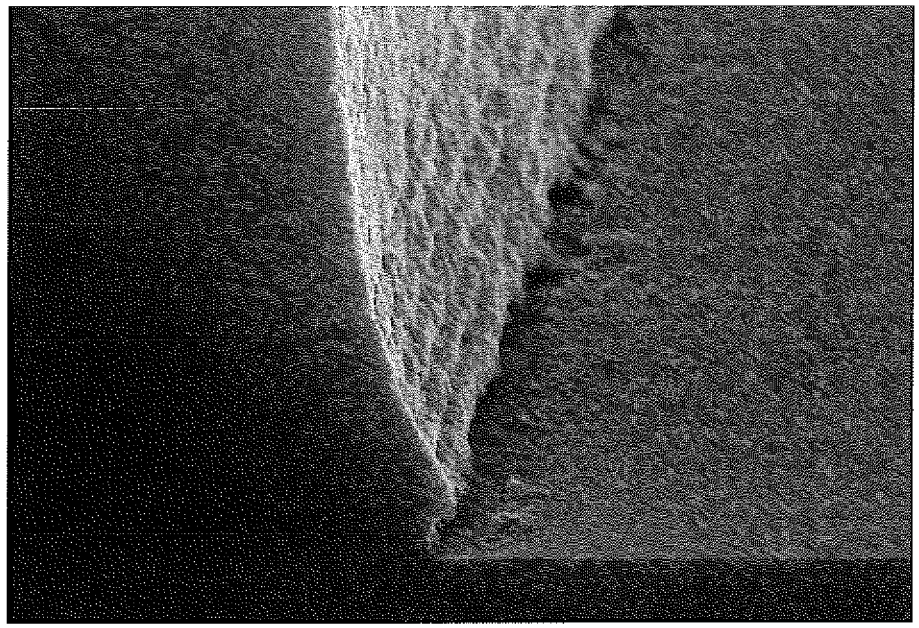
FIG. 3 is a SEM photomicrograph of a 5 μm line and space (L/S) pattern obtained in Example 7, which is formed by developing a positive-type photosensitive siloxane composition of 2 μm in thickness with a 2.38% TMAH aqueous solution.
Figure 4:
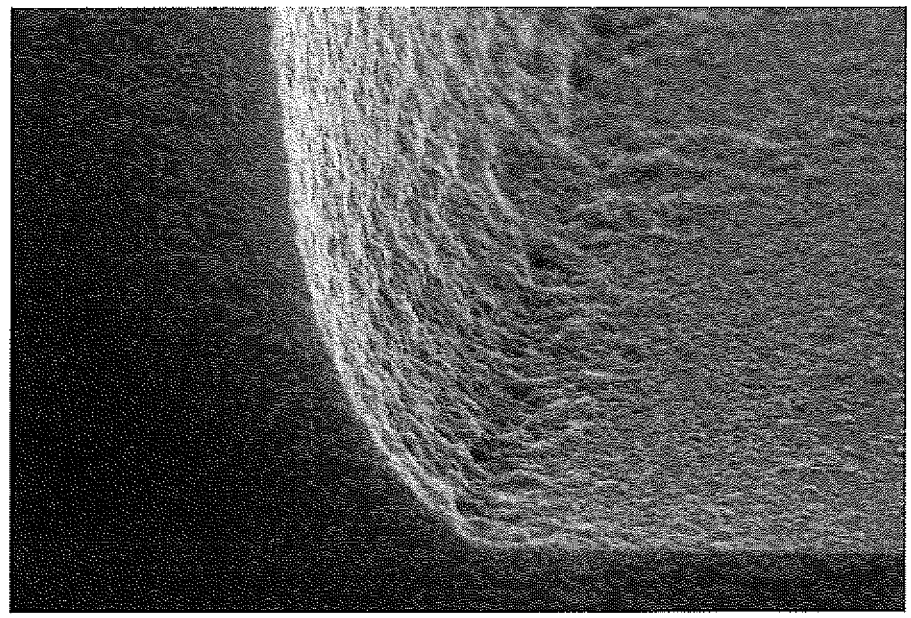
FIG. 4 is a SEM photomicrograph of a 5 μm line and space (L/S) pattern obtained in Comparative example 4, which is formed by developing a positive-type photosensitive siloxane composition of 2 μm in thickness with a 2.38% TMAH aqueous solution.

A photosensitive siloxane composition was prepared in the same manner as in Example 1 except for changing the ratio of polysiloxanes to Ia-1:Ib'-1:Ib"-1=35 wt-%:35 wt-%:30 wt-% and then preparing a 35% solution of the polysiloxane mixture with PGMEA, followed by adding 12 wt-% of PAC and 0.7 wt-% of polysiloxane II-1 (p-hydroxybenzylsilsesquioxane/methylsilsesquioxane copolymer) based on the total weigh of polysiloxanes 1a-1, Ib'-1 and Ib"-1. The photosensitive siloxane composition was applied, exposed, developed and rinsed in the same manner as in Example 1 except for preparing the photosensitive siloxane composition layer of 2.0 μm in thickness and exposing at a dose of 180 mJ/cm². The patterns obtained were observed with SEM and it was confirmed that 5 μm clear line and space (L/S) patterns and 5 μm clear contact hole (C/H) patterns, which have both no residue, were formed. A SEM photograph of the line and space (L/S) pattern is shown in FIG. 3.

Example 8

Positive-Type Photosensitive Siloxane Composition

A photosensitive siloxane composition was prepared in the same manner as in Example 1 except for changing the ratio of polysiloxanes to Ia-1:Ib'-1:Ib"-1=30 wt-%:40 wt-%:30 wt-% and then preparing a 35% solution of the polysiloxane mixture with PGMEA, followed by adding 12 wt-% of PAC and 0.7 wt-% of polysiloxane II-1 (p-hydroxybenzylsilsesquioxane/methylsilsesquioxane copolymer) based on the total weigh of polysiloxanes 1a-1, Ib'-1 and Ib"-1. The photosensitive siloxane composition was applied, exposed, developed and rinsed in the same manner as in Example 1 except for preparing the photosensitive layer of 3.0 μm in thickness and exposing at a dose of 200 mJ/cm². The patterns obtained were observed with SEM and it was confirmed that 5 μm clear line and space (L/S) patterns and 5 μm clear contact hole (C/H) patterns, which have both no residue, were formed.

Comparative Example 1

Positive-Type Photosensitive Siloxane Composition

A photosensitive siloxane composition was prepared in the same manner as in Example 1 except for not adding polysiloxane II-1 (p-hydroxybenzylsilsesquioxane/methylsilsesquioxane copolymer). The photosensitive siloxane composition was applied, exposed, developed and rinsed in the same manner as in Example 1. After this, the patterns obtained were observed with SEM. It was confirmed by the observation that development residues existed in both of 5 μm line and space (L/S) patterns and 5 μm contact hole (C/H) patterns.

Comparative Example 2

Positive-Type Photosensitive Siloxane Composition

Figure 2:
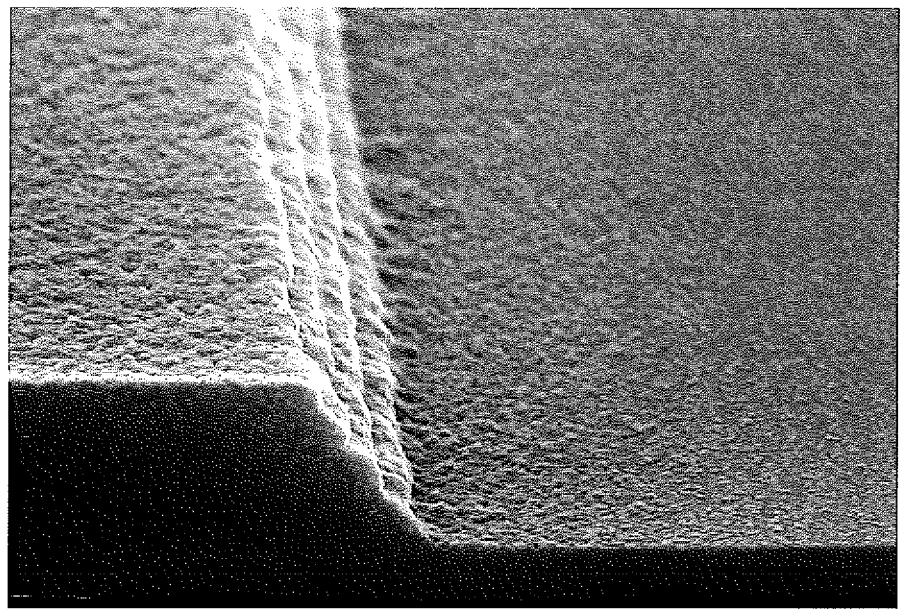
FIG. 2 is a SEM photomicrograph of a 5 μm line and space (L/S) pattern obtained in Comparative example 2, which is formed by developing a positive-type photosensitive siloxane composition of 0.5 μm in thickness with a 2.38% TMAH aqueous solution.

A photosensitive siloxane composition was prepared in the same manner as in Example 5 except for not adding polysiloxane II-1 (p-hydroxybenzylsilsesquioxane/methylsilsesquioxane copolymer). The photosensitive siloxane composition was applied, exposed, developed and rinsed in the same manner as in Example 5. After this, the patterns obtained were observed with SEM. It was confirmed by the observation that development residues existed in both of 5 μm line and space (L/S) patterns and 5 μm contact hole (C/H) patterns. A SEM photograph of the line and space (L/S) pattern is shown in FIG. 2.

Comparative Example 3

Positive-Type Photosensitive Siloxane Composition

A photosensitive siloxane composition was prepared in the same manner as in Example 6 except for not adding polysiloxane II-1 (p-hydroxybenzylsilsesquioxane/methylsilsesquioxane copolymer). The photosensitive siloxane composition was applied, exposed, developed and rinsed in the same manner as in Example 6. After this, the patterns obtained were observed with SEM. It was confirmed by the observation that development residues existed in both of 5 μm line and space (L/S) patterns and 5 μm contact hole (C/H) patterns.

Comparative Example 4

Positive-Type Photosensitive Siloxane Composition

A photosensitive siloxane composition was prepared in the same manner as in Example 7 except for not adding polysiloxane II-1 (p-hydroxybenzylsilsesquioxane/methylsilsesquioxane copolymer). The photosensitive siloxane composition was applied, exposed, developed and rinsed in the same manner as in Example 7. After this, the patterns obtained were observed with SEM. It was confirmed by the observation that development residues existed in both of 5 μm line and space (L/S) patterns and 5 μm contact hole (C/H) patterns.

Comparative Example 5

Positive-Type Photosensitive Siloxane Composition

A photosensitive siloxane composition was prepared in the same manner as in Example 8 except for not adding polysiloxane II-1 (p-hydroxybenzylsilsesquioxane/methylsilsesquioxane copolymer). The photosensitive siloxane composition was applied, exposed, developed and rinsed in the same manner as in Example 8. After this, the patterns obtained were observed with SEM. It was confirmed by the observation that development residues existed in both of 5 μm line and space (L/S) patterns and 5 μm contact hole (C/H) patterns.

Photosensitive siloxane compositions of Examples 1 to 8 and Comparative examples 1 to 5 are summarized in Tables 2.

TABLE 2

|  | Ia-1 (wt %) | Ib'-1 (wt %) | Ib"-1 (wt %) | II-1 (parts) | II-2 (parts) | PAC (parts) | Film thickness (μm) | Amount of Exposure (mJ/cm$^2$) |
|---|---|---|---|---|---|---|---|---|
| Example 1 | 40 | 30 | 30 | 1.0 |  | 12 | 1.0 | 150 |
| Example 2 | 40 | 30 | 30 |  | 1.0 | 12 | 1.0 | 150 |
| Example 3 | 40 | 30 | 30 | 2.0 |  | 12 | 1.0 | 140 |
| Example 4 | 40 | 30 | 30 |  | 1.5 | 12 | 1.0 | 150 |
| Example 5 | 25 |  | 75 | 1.5 |  | 9 | 0.5 | 200 |
| Example 6 | 30 | 10 | 60 | 1.5 |  | 9 | 0.5 | 200 |
| Example 7 | 35 | 35 | 30 | 0.7 |  | 12 | 2.0 | 180 |
| Example 8 | 30 | 40 | 30 | 0.7 |  | 12 | 3.0 | 200 |
| Comparative example 1 | 40 | 30 | 30 |  |  | 12 | 1.0 | 150 |
| Comparative example 2 | 25 |  | 75 |  |  | 9 | 0.5 | 200 |
| Comparative example 3 | 30 | 10 | 60 |  |  | 9 | 0.5 | 200 |
| Comparative example 4 | 35 | 35 | 30 |  |  | 12 | 2.0 | 180 |
| Comparative example 5 | 30 | 40 | 30 |  |  | 12 | 3.0 | 200 |

The invention claimed is:

1. A positive-type photosensitive siloxane composition consisting of (I) at least two kinds or more of polysiloxanes that differ in the rate of dissolution in tetramethylammonium hydroxide aqueous solutions, (II) a polysiloxane having a group soluble in a tetramethylammonium hydroxide aqueous solution, other than a silanol group, (III) a diazonaphthoquinone derivative, (IV) a solvent and (V) an optional component selected from the group consisting of surfactants, sensitizers and mixtures thereof, wherein the polysiloxane (I) is a mixture which consists of (A) a polysiloxane (Ia) obtained by hydrolyzing and condensing a silane compound represented by the formula (1):

$$R^1{}_n Si(OR^2)_{4-n} \quad (1)$$

wherein R$^1$ represents a liner, branched or cyclic alkyl group having 1 to 20 carbon atoms, in which any methylene group may be replaced with an oxygen atom, or an aryl group having 6 to 20 carbon atoms, in which any hydrogen atom may be replaced with a fluorine atom, R$^2$ represents an alkyl group having 1 to 5 carbon atoms, and n is 0 or 1, in the presence of a basic catalyst, a film after prebaking of which is soluble in a 5 wt-% tetramethylammonium hydroxide aqueous solution and has a rate of dissolution in the 5 wt-% tetramethylammonium hydroxide aqueous solution of 1,000 Å/second or less, and (B) a polysiloxane (Ib) obtained by hydrolyzing and condensing the silane compound represented by the aforementioned formula (1) in the presence of an acidic or basic catalyst, a film after prebaking of which has a rate of dissolution in a 2.38 wt-% tetramethylammonium hydroxide aqueous solution of 200 Å/second or more, and a rate of dissolution in a 2.38 wt-% tetramethylammonium hydroxide aqueous solution of the mixture is 50 to 1,000 Å/second, and the polysiloxane (II) having a group soluble in a tetramethylammonium hydroxide aqueous solution other than a silanol group is a polysiloxane, a film after prebaking of which has a rate of dissolution in a 2.38 wt-% tetramethylammonium hydroxide aqueous solution of 50 to 1,000 Å/second.

2. The positive-type photosensitive siloxane composition according to claim 1, wherein the polysiloxane (Ib) contains a polysiloxane (Ib'), a film after prebaking of which has a rate of dissolution in a 2.38 wt-% tetramethylammonium hydroxide aqueous solution of 3,000 Å/second or more and/or a polysiloxane (Ib"), a film after prebaking of which has a rate of dissolution in a 2.38 wt-% tetramethylammonium hydroxide aqueous solution of 200 to 3,000 Å/second, both of which are obtained by hydrolyzing and condensing a silane compound represented by the aforementioned formula (1), wherein R$^1$ represents a liner, branched or cyclic alkyl group having 1 to 20 carbon atoms, in which any methylene group may be replaced with an oxygen atom, or an aryl group having 6 to 20 carbon atoms, in which any hydrogen atom may be replaced with a fluorine atom, R$^2$ represents an alkyl group having 1 to 5 carbon atoms, and n is 0 or 1, in the presence of an acidic or basic catalyst.

3. The positive-type photosensitive siloxane composition according to claim 1, wherein the positive-type photosensitive siloxane composition contains at least a polysiloxane (Ia) and a polysiloxane (Ib") and is used as a film of 1.5 μm or less in thickness.

4. The positive-type photosensitive siloxane composition according to claim 1, wherein the polysiloxane (II) having a group soluble in a tetramethylammonium hydroxide aqueous solution, a film after prebaking of which has a rate of dissolution in a 2.38 wt % tetramethylammonium hydroxide aqueous solution of 50 to 1,000 Å/second, is obtained by hydrolyzing and condensing at least one kind of a silanol compound represented by the formula (2) described below in the presence of an acidic or basic catalyst Formula (2):

Wherein, $R^3$ represents a group having at least one group $R^3a$ soluble in a 2.38 wt-% tetramethylammonium hydroxide aqueous solution, $R^3a$ represents a phenolic hydroxyl group, a carboxylic acid group or a salt thereof, a carboxylic anhydride group, a sulfonic aid group or a salt thereof, a thiol group, a cyano group, or —CO—$R^7$, in which $R^7$ represents a hydrogen atom or an alkyl, alkenyl or alkoxy group having 1 to 5 carbon atoms, and $R^4$ represents an alkyl group having 1 to 5 carbon atoms.

5. The positive-type photosensitive siloxane composition according to claim 4, wherein the polysiloxane (II) is obtained from at least one silane compound represented by the formula (2) described above and at least one silane compound represented by the following formula (3)

Formula (3):

Wherein, $R^5$ represents a methyl group or a phenyl group and $R^6$ represents an alkyl group having 1 to 5 carbon atoms.

6. The positive-type photosensitive siloxane composition according to claim 4, wherein $R^3$ is a group represented by the following formula (4)

Formula (4):

wherein X represents a single bond or an alkylene group having 1 to 10 carbon atoms, in which one —CH$_2$— may be replaced with —CH=CH—, —O—, —CO— or —COO—, M represents a single bond, an cyclic alkyl group having 5 to 10 carbon atoms, a phenyl group or a naphthalene group, which may have a substituent, $R^3a$ represents a phenolic hydroxyl group, a carboxylic acid group or a salt thereof, a carboxylic anhydride group, a sulfonic aid group or a salt thereof, a thiol group, a cyano group, or —CO—$R^7$, in which $R^7$ represents a hydrogen atom or an alkyl, alkenyl or alkoxy group having 1 to 5 carbon atoms, and is a group selected from a carboxylic acid group or a salt thereof, a carboxylic anhydride group, a sulfonic aid group or a salt thereof, a thiol group, or a cyano group when M is a cyclic alkyl group, or a group selected from a hydroxyl group, a carboxylic acid group or a salt thereof, a carboxylic anhydride group, a sulfonic aid group or a salt thereof, a thiol group, or a cyano group when M is a phenyl group or a naphthalene group. Furthermore, $R^3a$ may be multiply-substituted to M and in the case, the mutual $R^3a$'s may be the same or different from each other.

7. The positive-type photosensitive siloxane composition according to claim 5, wherein the polysiloxane (II) is a polysiloxane represented by the following structure

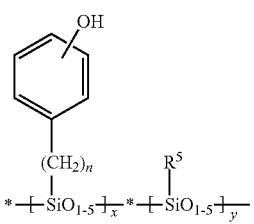

Wherein, $R^5$ represents a methyl group or a phenyl group, n is 0 to 10 but one —CH$_2$— in an alkylene group may be replaced with —CH=CH—, —O—, —CO— or —COO—, x and y represent a copolymerization ratio (mole-%), and x:y is from 10:90 to 90:10.

8. The positive-type photosensitive siloxane composition according to claim 5, wherein the polysiloxane (II) is a polysiloxane represented by the following structure

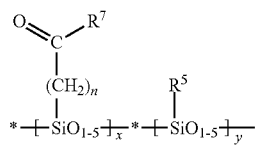

Wherein $R^5$ represents a methyl group or a phenyl group, $R^7$ represents a hydrogen atom or an alkyl, alkenyl or alkoxy group having 1 to 5 carbon atoms, n is 0 to 10 but one —CH$_2$— in an alkylene group may be replaced with —CH=CH—, —O—, —CO— or —COO—, x and y represent a copolymerization ratio (mole-%), and x:y is from 10:90 to 90:10.

9. The positive-type photosensitive siloxane composition according to claim 1, wherein the blending amount of the polysiloxane (II) is 0.1 to 5.0 weight parts based on 100 weight parts of the polysiloxane (I).

10. A cured film which is formed from the positive-type photosensitive siloxane composition according to claim 1.

11. The positive-type photosensitive siloxane composition according to claim 2, wherein the polysiloxane (II) having a group soluble in a tetramethylammonium hydroxide aqueous solution, a film after prebaking of which has a rate of dissolution in a 2.38 tetramethylammonium hydroxide aqueous solution of 50 to 1,000 Å/second, is obtained by hydrolyzing and condensing at least one kind of a silanol compound represented by the formula (2) described below in the presence of an acidic or basic catalyst Formula (2):

$$R^3Si(OR^4)_3 \quad (2)$$

Wherein, $R^3$ represents a group having at least one group $R^3a$ soluble in a 2.38 wt-% tetramethylammonium hydroxide aqueous solution, $R^3a$ represents a phenolic hydroxyl group, a carboxylic acid group or a salt thereof, a carboxylic anhydride group, a sulfonic aid group or a salt thereof, a thiol group, a cyano group, or —CO—$R^7$, in which $R^7$ represents a hydrogen atom or an alkyl, alkenyl or alkoxy group having 1 to 5 carbon atoms, and $R^4$ represents an alkyl group having 1 to 5 carbon atoms.

12. The positive-type photosensitive siloxane composition according to claim 3, wherein the polysiloxane (II) having a group soluble in a tetramethylammonium hydroxide aqueous solution, a film after prebaking of which has a rate of dissolution in a 2.38 tetramethylammonium hydroxide aqueous solution of 50 to 1,000 Å/second, is obtained by hydrolyzing and condensing at least one kind of a silanol compound represented by the formula (2) described below in the presence of an acidic or basic catalyst
Formula (2):

$$R^3Si(OR^4)_3 \qquad (2)$$

Wherein, $R^3$ represents a group having at least one group $R^3a$ soluble in a 2.38 wt-% tetramethylammonium hydroxide aqueous solution, $R^3a$ represents a phenolic hydroxyl group, a carboxylic acid group or a salt thereof, a carboxylic anhydride group, a sulfonic aid group or a salt thereof, a thiol group, a cyano group, or —CO—$R^7$, in which $R^7$ represents a hydrogen atom or an alkyl, alkenyl or alkoxy group having 1 to 5 carbon atoms, and $R^4$ represents an alkyl group having 1 to 5 carbon atoms.

13. The positive-type photosensitive siloxane composition according to claim 5, wherein $R^3$ is a group represented by the following formula (4)
Formula (4):

$$—X-M-R^3a \qquad (4)$$

wherein X represents a single bond or an alkylene group having 1 to 10 carbon atoms, in which one —CH$_2$— may be replaced with —CH═CH—, —O—, —CO— or —COO—, M represents a single bond, an cyclic alkyl group having 5 to 10 carbon atoms, a phenyl group or a naphthalene group, a which may have substituent, $R^3a$ represents a phenolic hydroxyl group, a carboxylic acid group or a salt thereof, a carboxylic anhydride group, a sulfonic aid group or a salt thereof, a thiol group, a cyano group, or —CO—$R^7$, in which $R^7$ represents a hydrogen atom or an alkyl, alkenyl or alkoxy group having 1 to 5 carbon atoms, and is a group selected from a carboxylic acid group or a salt thereof, a carboxylic anhydride group, a sulfonic aid group or a salt thereof, a thiol group, or a cyano group when M is a cyclic alkyl group, or a group selected from a hydroxyl group, a carboxylic acid group or a salt thereof, a carboxylic anhydride group, a sulfonic aid group or a salt thereof, a thiol group, or a cyano group when M is a phenyl group or a naphthalene group Furthermore, $R^3a$ may be multiply-substituted to M and in the case, the mutual $R^3a$'s may be the same or different from each other.

14. A cured film which is formed from the positive-type photosensitive siloxane composition according to claim 2.

15. A cured film according to claim 2, wherein the cured film is selected from the group consisting of a planarization film, an insulator, a transparent protective film and a luminous diode.

* * * * *

UNITED STATES PATENT AND TRADEMARK OFFICE
CERTIFICATE OF CORRECTION

| | |
|---|---|
| PATENT NO. | : 9,580,567 B2 |
| APPLICATION NO. | : 14/439870 |
| DATED | : February 28, 2017 |
| INVENTOR(S) | : Toshiaki Nonaka et al. |

It is certified that error appears in the above-identified patent and that said Letters Patent is hereby corrected as shown below:

On the Title Page

Item (72), Line 2, delete "Daishi Tokoyama" and insert --Daishi Yokoyama--

Signed and Sealed this
Eighteenth Day of July, 2017

Joseph Matal
*Performing the Functions and Duties of the*
*Under Secretary of Commerce for Intellectual Property and*
*Director of the United States Patent and Trademark Office*